United States Patent
Chen et al.

(10) Patent No.: US 12,211,896 B2
(45) Date of Patent: *Jan. 28, 2025

(54) HIGH VOLTAGE DEVICE WITH GATE EXTENSIONS

(71) Applicant: Taiwan Semiconductor Manufacturing Company, Ltd., Hsin-Chu (TW)

(72) Inventors: Jhih-Bin Chen, Hsinchu (TW); Ming Chyi Liu, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/403,076

(22) Filed: Jan. 3, 2024

(65) Prior Publication Data
US 2024/0136397 A1    Apr. 25, 2024

Related U.S. Application Data

(60) Continuation of application No. 17/734,344, filed on May 2, 2022, now Pat. No. 11,908,891, which is a
(Continued)

(51) Int. Cl.
*H01L 29/06* (2006.01)
*H01L 29/08* (2006.01)
*H01L 29/78* (2006.01)

(52) U.S. Cl.
CPC ...... *H01L 29/0653* (2013.01); *H01L 29/0692* (2013.01); *H01L 29/0873* (2013.01); *H01L 29/7825* (2013.01)

(58) Field of Classification Search
CPC ......... H01L 29/06; H01L 29/08; H01L 29/78; H01L 29/66; H01L 29/0653;
(Continued)

(56) References Cited

U.S. PATENT DOCUMENTS 6,228,729 B1   5/2001  Ni
6,492,678 B1  12/2002  Hebert
(Continued)

FOREIGN PATENT DOCUMENTS

JP    2009032820 A   2/2009
JP    2009170468 A   7/2009
(Continued)

OTHER PUBLICATIONS

Abouelatta-Ebrahim et al. "Design Considerations of High Voltage RESURF nLDMOS: An Analytical and Numerical Study." Ain Shams Engineering Journal (2015) 6, 501-509, published on Feb. 7, 2015.
(Continued)

*Primary Examiner* — Chuong A Luu
(74) *Attorney, Agent, or Firm* — Eschweiler & Potashnik, LLC

(57) ABSTRACT

The present disclosure relates to an integrated chip. The integrated chip includes a source region disposed within a substrate, and a drain region disposed within the substrate and separated from the source region. A plurality of separate isolation structures are disposed within the substrate. The plurality of separate isolation structures have outermost sidewalls that face one another and that are separated from one another. A gate electrode is disposed within the substrate. The gate electrode includes a base region disposed between the source region and the plurality of separate isolation structures and a plurality of gate extensions extending outward from a sidewall of the base region to over the plurality of separate isolation structures.

20 Claims, 16 Drawing Sheets

Related U.S. Application Data division of application No. 16/921,075, filed on Jul. 6, 2020, now Pat. No. 11,329,128.

(60) Provisional application No. 62/893,340, filed on Aug. 29, 2019.

(58) Field of Classification Search
CPC ............ H01L 29/0692; H01L 29/7825; H01L 29/0873; H01L 29/423; H01L 29/4238; H01L 29/42368; H01L 29/4236; H01L 29/66659; H01L 29/7835; H01L 29/7813; H01L 29/66704; H01L 29/42356; H01L 29/66613; H01L 29/66628; H01L 29/42336; H01L 29/42352; H01L 29/0649; H01L 29/51; H01L 29/518; H01L 21/28; H01L 21/28008
USPC ....................................................... 257/344
See application file for complete search history.

(56) References Cited

U.S. PATENT DOCUMENTS

| | | | |
|---|---|---|---|
| 8,772,871 | B2 | 7/2014 | Yang et al. |
| 11,329,128 | B2 * | 5/2022 | Chen ............... H01L 29/0692 |
| 2003/0038316 | A1 | 2/2003 | Tsuchiko et al. |
| 2007/0087504 | A1 | 4/2007 | Pham et al. |
| 2007/0194387 | A1 | 8/2007 | Dyer et al. |
| 2009/0140343 | A1 | 6/2009 | Feilchenfeld et al. |
| 2010/0252882 | A1 | 10/2010 | Denison et al. |
| 2013/0075803 | A1 | 3/2013 | Edrei et al. |
| 2013/0341714 | A1 | 12/2013 | Jang et al. |
| 2018/0145136 | A1 | 5/2018 | Chou et al. |
| 2018/0337273 | A1 | 11/2018 | Losee et al. |

FOREIGN PATENT DOCUMENTS

| | | |
|---|---|---|
| KR | 20170079984 A | 7/2017 |
| KR | 20170080966 A | 7/2017 |

OTHER PUBLICATIONS

Severens, I.E.M. & Philips Electronics. "The Drift Region of High-Voltage MOS Devices." Published Nov. 2000.
ON Semiconductor. "Understanding Power Transistors Breakdown Parameters." Semiconductor Components Industries, LLC, published Mar. 2017.
Sonsky. "Dielectric Resurf: Breakdown Voltage Control by STI Layout in Standard CMOS." IEEE International Electron Devices Meeting, 2005. IEDM Technical Digest, published on Apr. 3, 2006.
Barkhordarian et al. "Power MOSFET Basics." International Rectifier. Published in 1997.
Khan, Tahair. Session 2: Power Semiconductor Technologies "PMIC technologies for integrated DC-DC converters" International Workshop on Power Supply on Chip 2012, published on Nov. 16, 2012.
Non-Final Office Action dated Jun. 23, 2021 for U.S. Appl. No. 16/921,075.
Notice of Allowance dated Jan. 10, 2022 for U.S. Appl. No. 16/921,075.
Non-Final Office Action dated Jun. 13, 2023 for U.S. Appl. No. 17/734,344.
Notice of Allowance dated Oct. 20, 2023 for U.S. Appl. No. 17/734,344.

\* cited by examiner

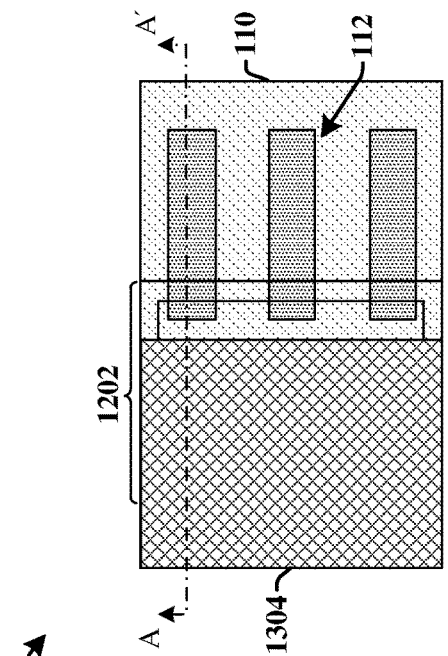
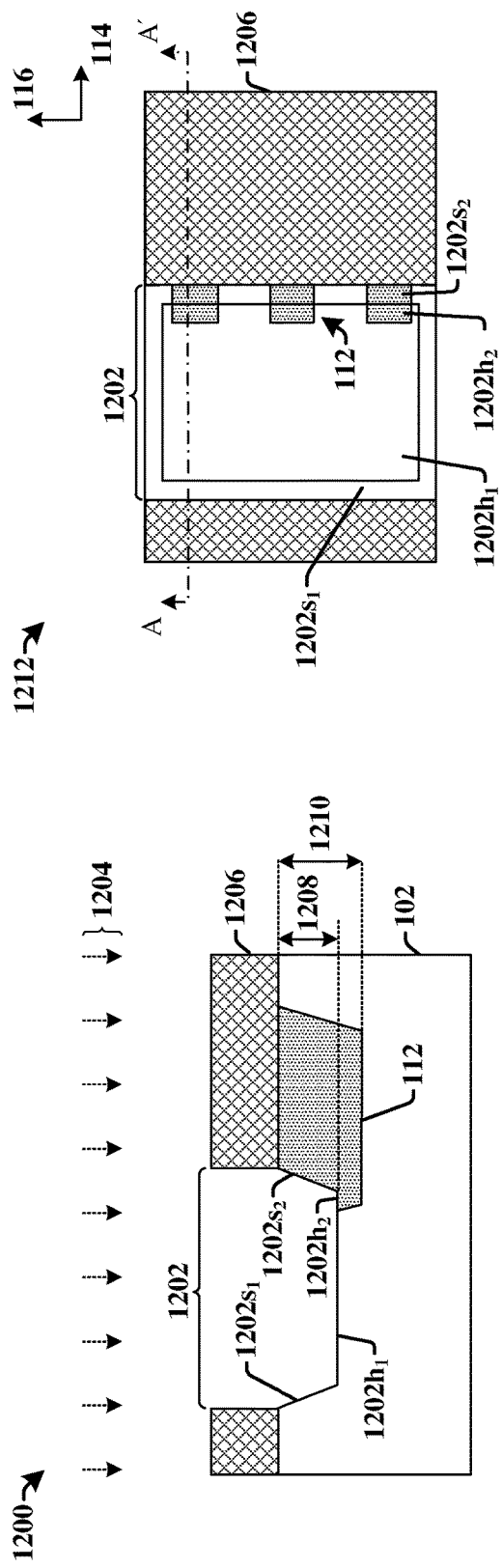
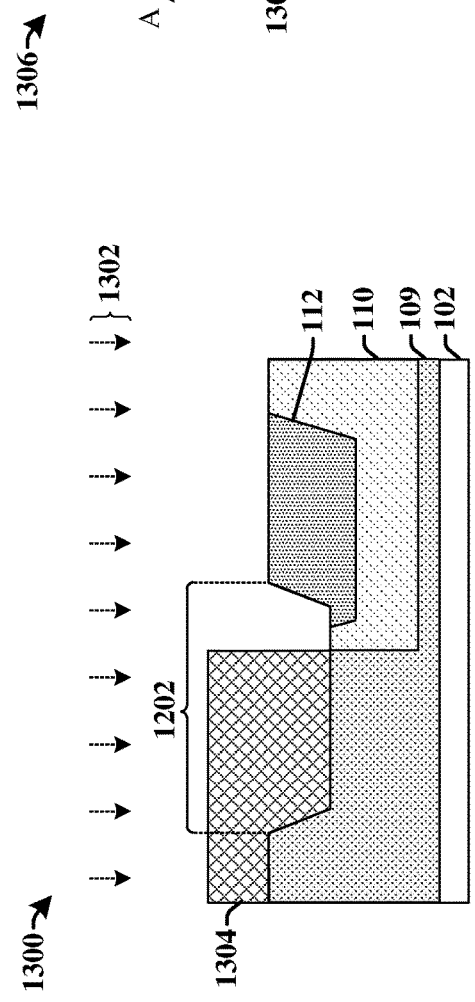

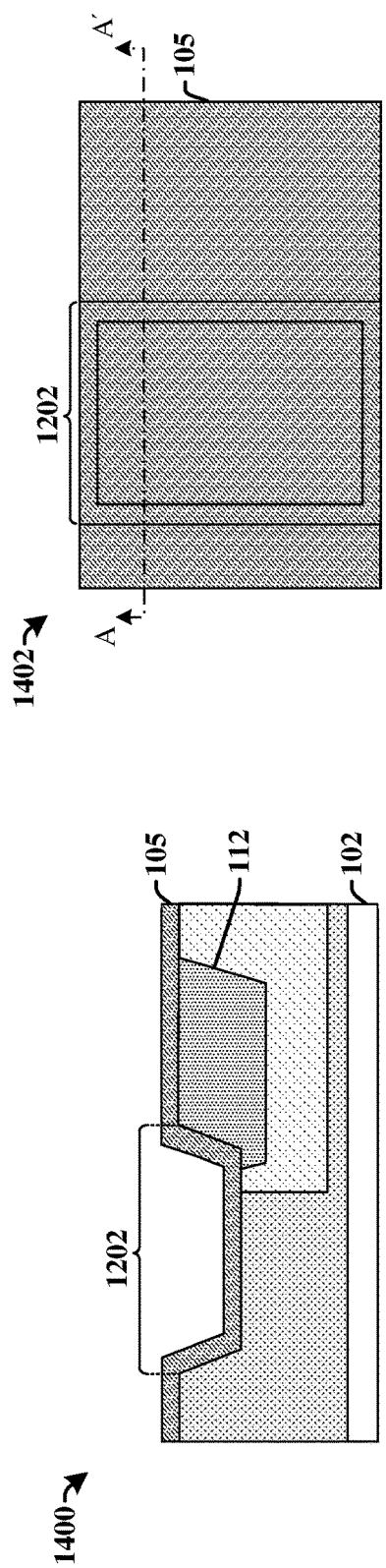
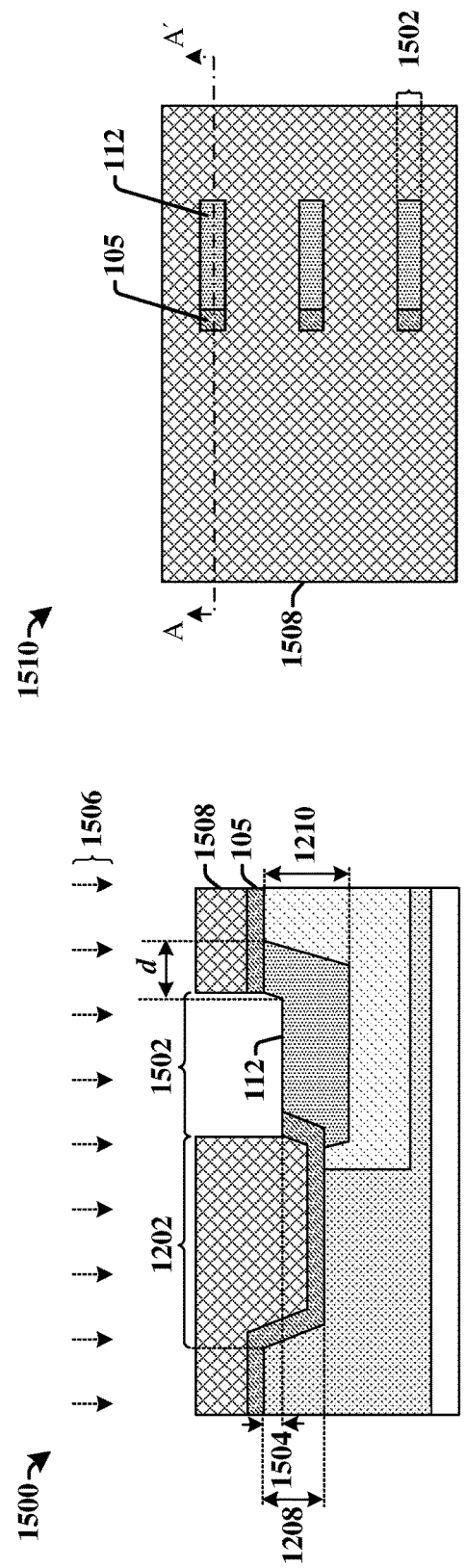
Fig. 14A
Fig. 14B
Fig. 15A
Fig. 15B

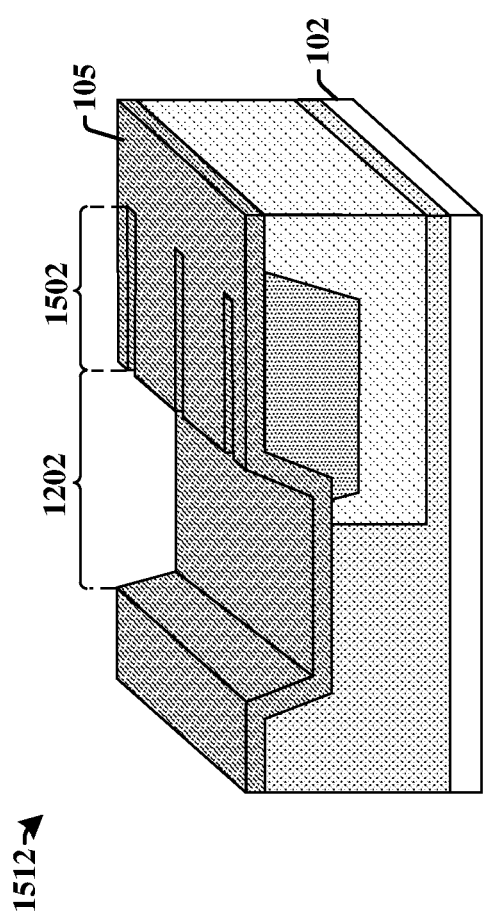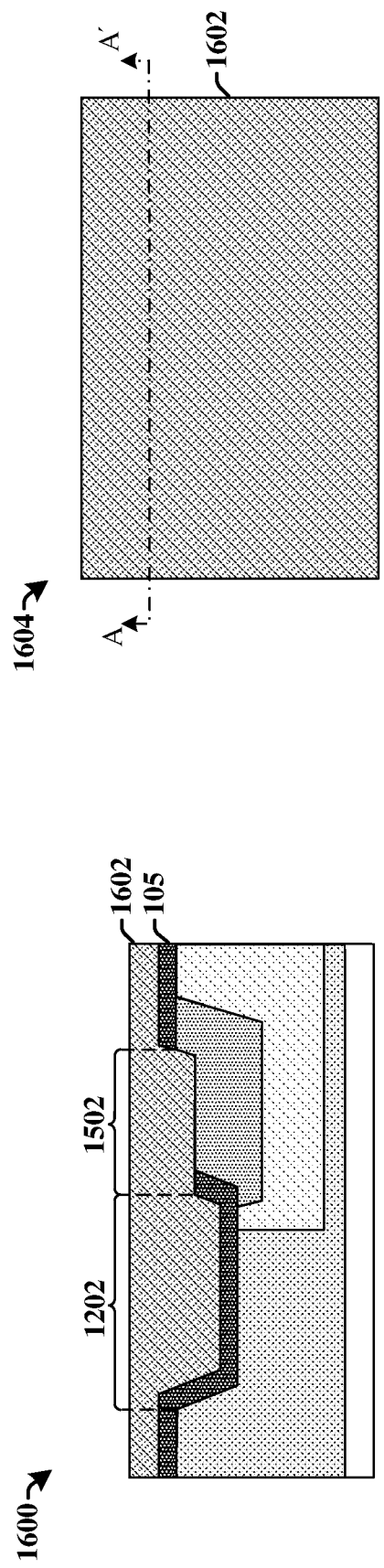
Fig. 15C
Fig. 16B
Fig. 16A

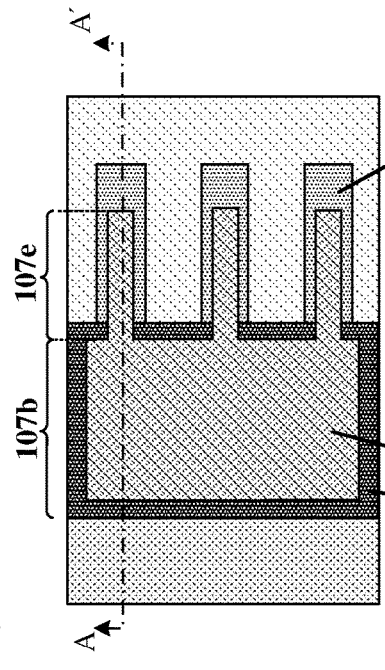
Fig. 17A
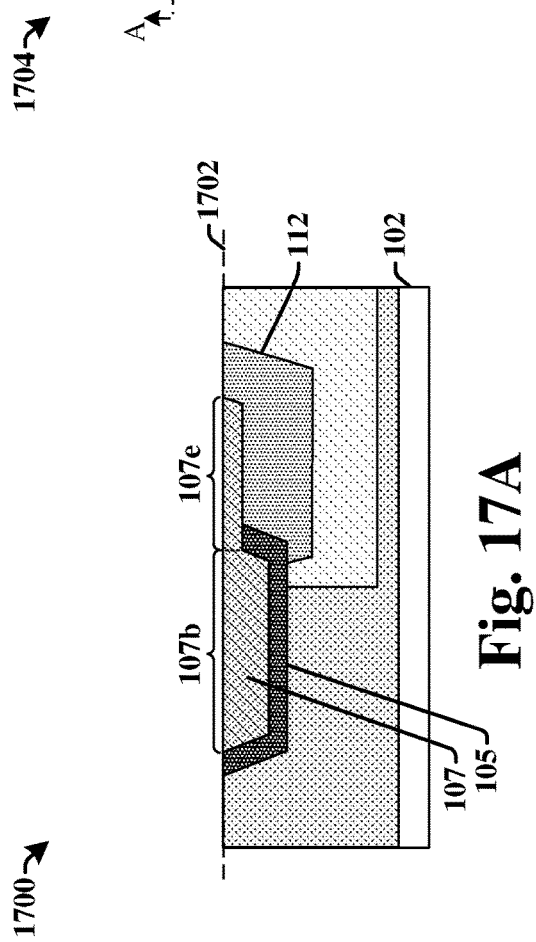
Fig. 17B
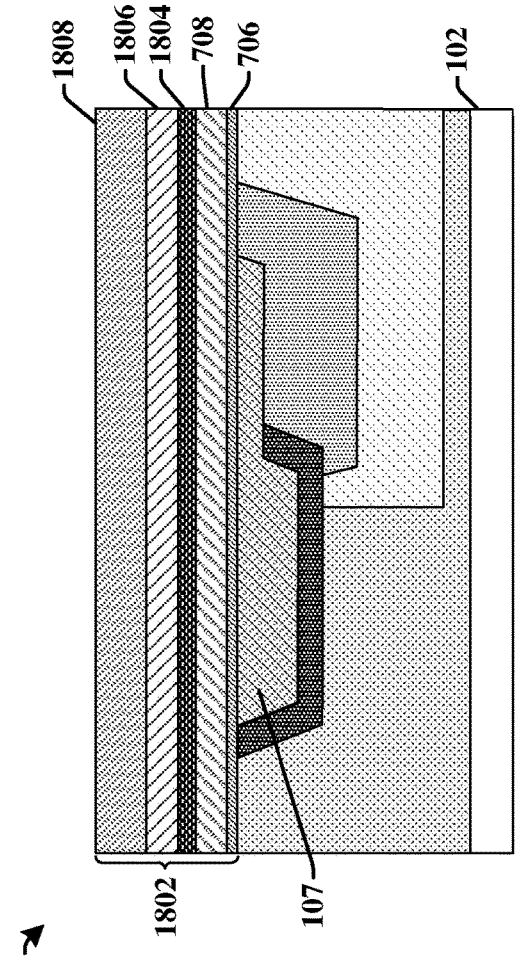
Fig. 18

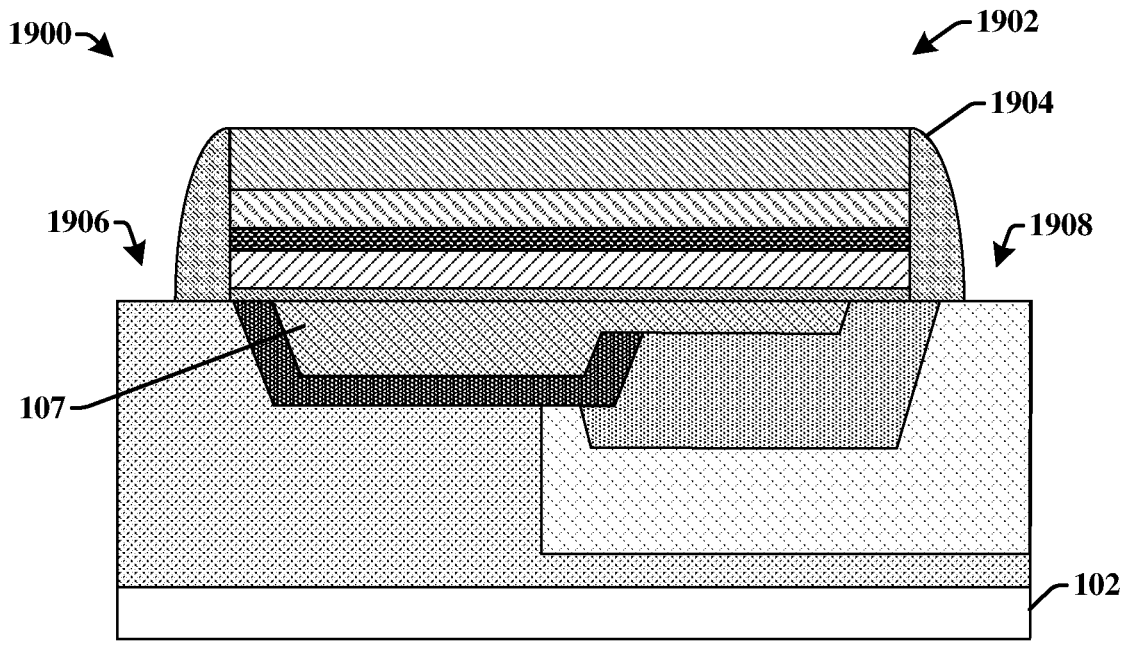
Fig. 19
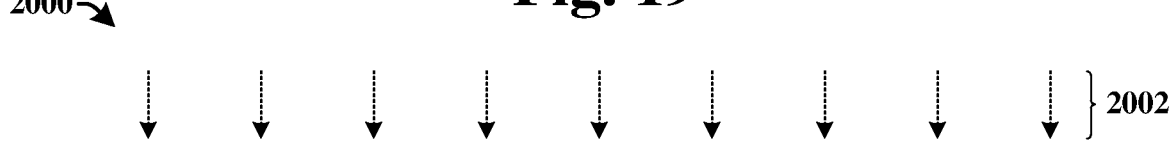
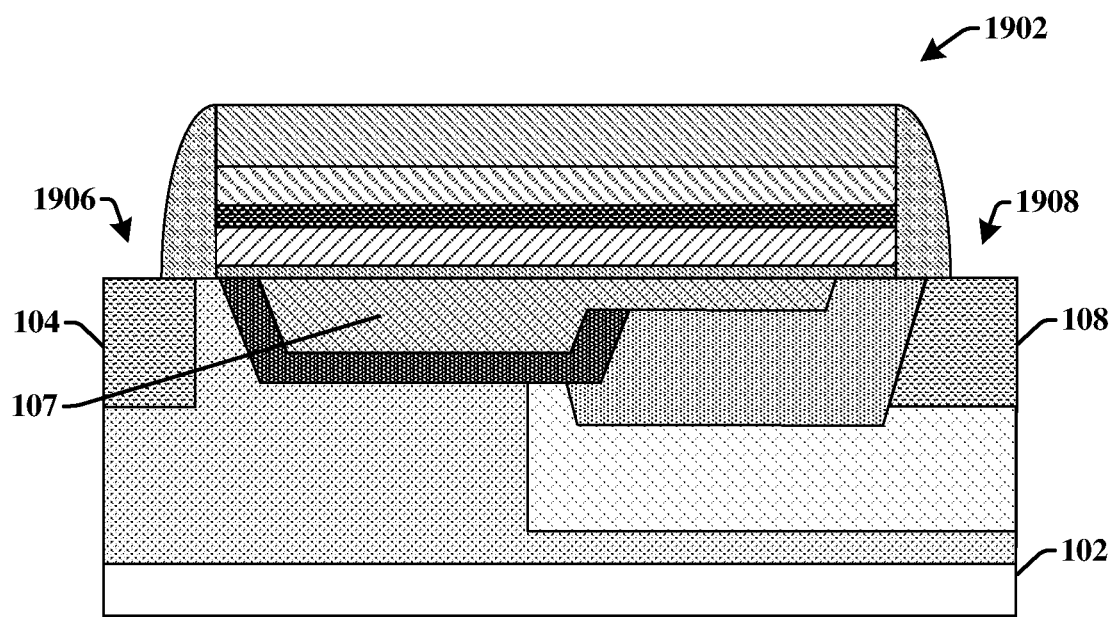
Fig. 20

HIGH VOLTAGE DEVICE WITH GATE EXTENSIONS

REFERENCE TO RELATED APPLICATIONS

This application is a Continuation of U.S. application Ser. No. 17/734,344, filed on May 2, 2022, which is a Divisional of U.S. application Ser. No. 16/921,075, filed on Jul. 6, 2020 (now U.S. Pat. No. 11,329,128, issued on May 10, 2022), which claims the benefit of U.S. Provisional Application No. 62/893,340, filed on Aug. 29, 2019. The contents of the above-referenced patent applications are hereby incorporated by reference in their entirety.

BACKGROUND

Modern day integrated chips comprise millions or billions of semiconductor devices formed on a semiconductor substrate (e.g., silicon). Integrated chips (ICs) may use many different types of transistor devices, depending on an application of an IC. In recent years, the increasing market for cellular and RF (radio frequency) devices has resulted in a significant increase in the use of high voltage transistor devices. For example, high voltage transistor devices are often used in power amplifiers for RF transmission/receiving chains due to their ability to handle high breakdown voltages (e.g., greater than about 50V) and high frequencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 10A-24 illustrate cross-sectional views of some embodiments of a method of forming an integrated chip having a high voltage transistor device comprising a recessed gate electrode with gate extensions.

DETAILED DESCRIPTION

Figure 1:
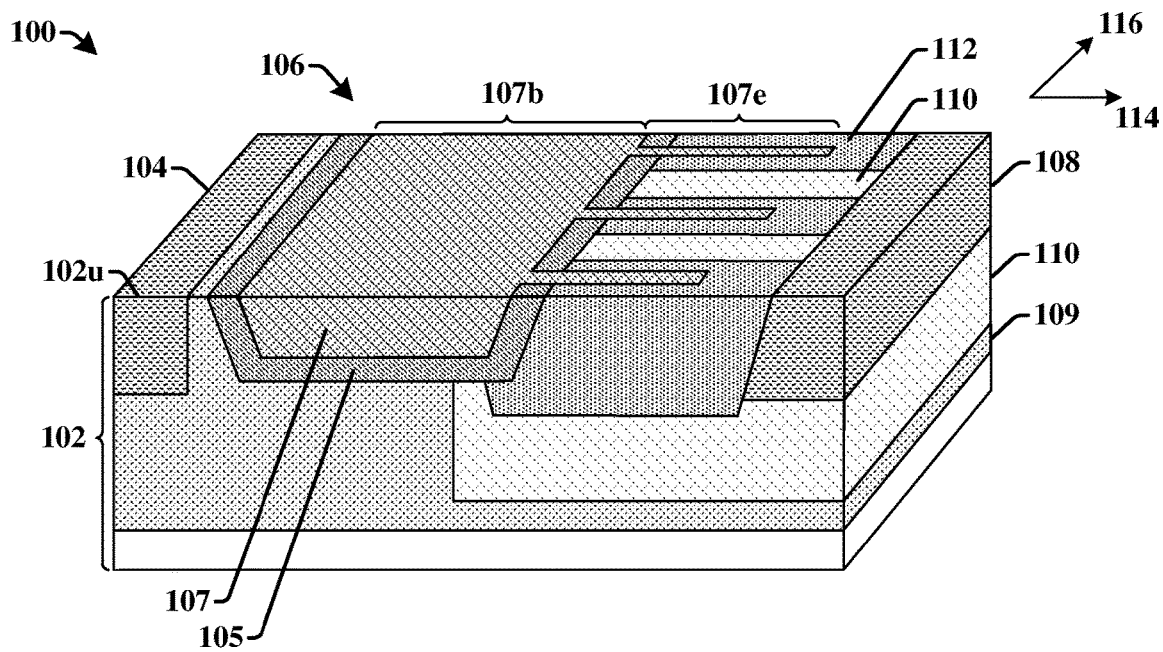
FIG. 1 illustrates a three-dimensional view of some embodiments of an integrated chip having a high voltage transistor device comprising a gate electrode with gate extensions.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated chips often comprise transistors that are designed to operate at a number of different voltages. High voltage transistors are design to operate at a high breakdown voltage (e.g., a breakdown voltage of greater than approximately 20V, greater than approximately 50V, or other suitable values). One type of commonly used high voltage transistor is a laterally diffused MOSFET (LDMOS) device. An LDMOS device has a gate structure that is disposed over a substrate between a source region and a drain region. The gate structure is separated from the drain region by way of a drift region. The drift region comprises a lightly doped region of the substrate (e.g., a region of the substrate having a doping concentration that is less than that of the source region and/or the drain region).

During operation, a bias voltage may be applied to the gate structure to form an electric field that causes a channel region to extend below the gate structure and through the drift region. A breakdown voltage of the LDMOS device is typically proportional to a size and doping concentration of the drift region (e.g., a larger drift region will result in a larger breakdown voltage). However, if an electric field within the device is not uniform the breakdown voltage of the transistor device may be negatively affected. For example, the breakdown voltage of a LDMOS can be negatively affected due to spikes in the electric field that can occur at a p-n junction between the drift region and the substrate.

The present disclosure, in some embodiments, relates to an integrated chip comprising a transistor device having a gate electrode with a plurality of gate extensions that are configured to provide the transistor device with a high breakdown voltage. The gate electrode is disposed within a substrate between a source region and a drain region. A drift region is located between the gate electrode and the drain region. The plurality of gate extensions laterally protrude outward from a sidewall of the gate electrode and to over the drift region. The plurality of gate extensions are configured to generate an electric field within the drift region, which can laterally spread charges along a p-n junction of the device. By laterally spreading the charges, an electric field along a surface of the substrate can be spread out, thereby reducing spikes in the electric field and increasing a breakdown voltage of the transistor device.

FIG. 1 illustrates a three-dimensional view of some embodiments of an integrated chip 100 having a high voltage transistor device comprising a gate electrode with gate extensions.

The integrated chip 100 comprises a gate structure 106 disposed within a substrate 102. In some embodiments, the gate structure 106 is recessed within the substrate 102. In some such embodiments, the gate structure 106 extends from below an upper surface 102u of the substrate 102 to the upper surface 102u of the substrate 102. A source region 104 is disposed on a first side of the gate structure 106 and a drain region 108 is disposed on a second side of the gate structure 106 opposite the first side. The source region 104 and the drain region 108 are separated by the gate structure 106 along a first direction 114.

A drift region 110 is arranged between the gate structure 106 and the drain region 108 along the first direction 114. In some embodiments, a well region 109 may be disposed within the substrate 102 below the gate structure 106 and laterally contacting the drift region 110. One or more isolation structures 112 are disposed within the drift region 110. The one or more isolation structures 112 extend in the first direction 114 between the gate structure 106 and the drain region 108 along the upper surface of the substrate 102. The one or more isolation structures 112 are separated from one another by the drift region 110 along a second direction 116 that is perpendicular to the first direction 114. In some embodiments, sidewalls of the one or more isolation structures 112 extend along the first direction 114 in parallel with one another. In some embodiments, the one or more isolation structures 112 comprise one or more dielectric materials disposed within trenches in the substrate 102. In some embodiments, the one or more isolation structures 112 may comprise shallow trench isolation (STI) structures.

The gate structure 106 comprises a gate dielectric 105 and a gate electrode 107 over the gate dielectric 105. The gate electrode 107 comprises a base region 107b and one or more gate extensions 107e. The base region 107b is separated from the drift region 110 by the gate dielectric 105. In some embodiments, the gate dielectric 105 continuously extends from a first side of the base region 107b to an opposing second side of the base region 107b. The one or more gate extensions 107e protrude laterally outward from a sidewall of the base region 107b of the gate electrode 107 to within the one or more isolation structures 112. The one or more isolation structures 112 laterally and vertically separate the one or more gate extensions 107e from the drift region 110. In some embodiments, the one or more gate extensions 107e extend through a sidewall of the gate dielectric 105.

During operation, a bias voltage may be applied to the gate electrode 107. The bias voltage causes charges (e.g., positive or negative charges) within the gate electrode 107 to form an electric field in the underlying substrate 102. Typically, the maximum breakdown voltage of the transistor device may be limited by junction edge breakdown effects due to surface field crowding at a junction of the drift region 110 and the well region 109. However, the electric field generated by the one or more gate extensions 107e laterally spreads the electric field along the surface of the substrate 102 (e.g., along the second direction 116). By spreading the electric field, the one or more gate extensions 107e reduce an electric field strength along a surface of the substrate 102, thereby allowing for a higher breakdown voltage to be achieved by the transistor device.

Figure 2A:
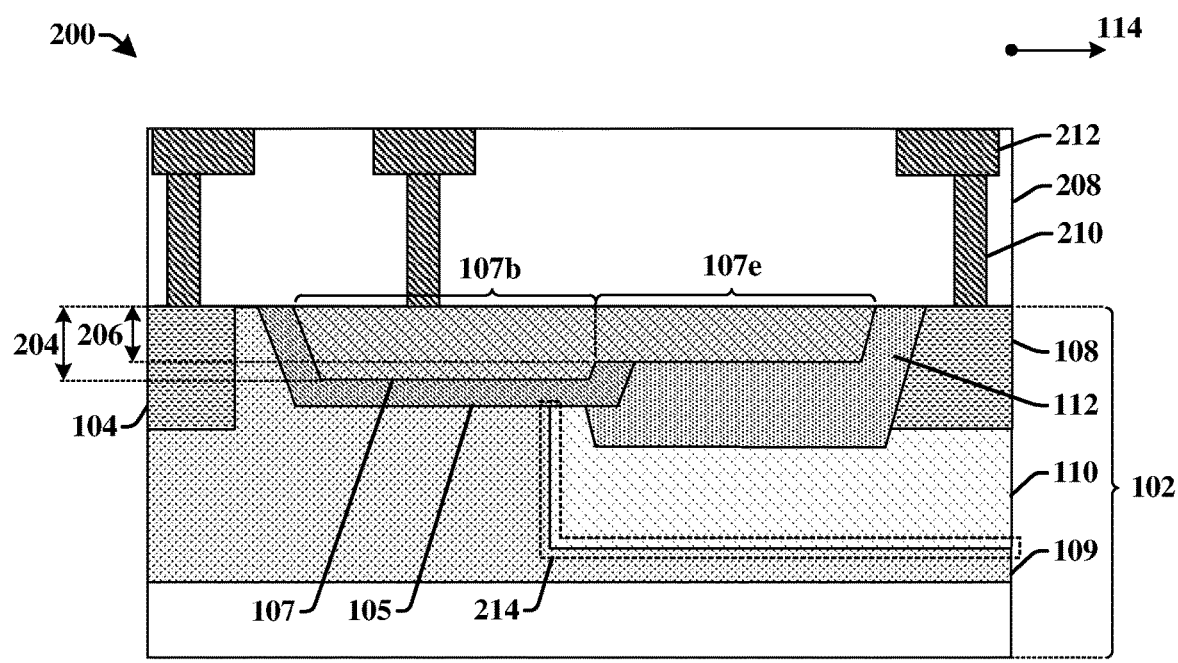
FIGS. 2A-2D illustrate some additional embodiments of an integrated chip having a high voltage transistor device comprising a recessed gate electrode with gate extensions.
Figure 2B:
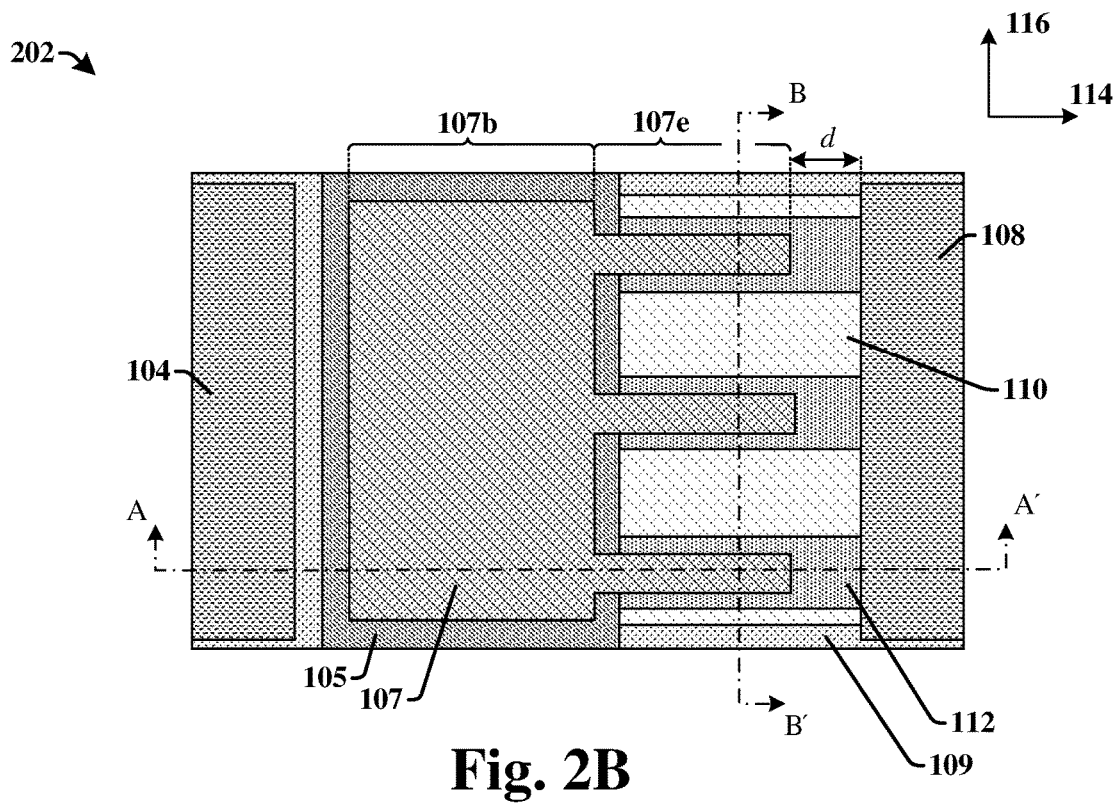
Figure 2C:
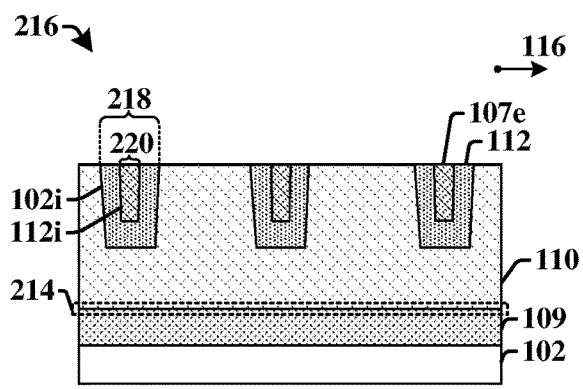

FIGS. 2A-2C illustrate some additional embodiments of an integrated chip having a high voltage transistor device comprising a recessed gate electrode with gate extensions.

As shown in cross-sectional view 200 of FIG. 2A, the integrated chip comprises a source region 104 and a drain region 108 disposed within a substrate 102. A drift region 110 is arranged between the source region 104 and the drain region 108. In some embodiments, a well region 109 may surround the source region 104, the drain region 108, and the drift region 110. In some embodiments, the substrate 102 and the well region 109 may have a first doping type (e.g., p-type), while the source region 104, the drain region 108, and the drift region 110 may have a second doping type (e.g., n-type). In some embodiments, the drift region 110 may have the second doping type (e.g., n-type), but with a lower doping concentration than the source region 104 and/or the drain region 108.

A gate electrode 107 is disposed within the substrate 102 between the source region 104 and the drain region 108. The gate electrode 107 is separated from the drain region 108 by the drift region 110. The gate electrode 107 comprises a base region 107b and one or more gate extensions 107e. The one or more gate extensions 107e extend outward from the base region 107b along a first direction 114 to directly over the drift region 110. The base region 107b is surrounded by a gate dielectric 105. The one or more gate extensions 107e are surrounded by one or more isolation structures 112 arranged within the drift region 110. In some embodiments, the one or more gate extensions 107e may extend directly over upper surfaces of the one or more isolation structures 112 and the gate dielectric 105. In some embodiments, the one or more gate extensions 107e may have a bottom surface that is in contact with both an upper surface of the gate dielectric 105 and an upper surface of the one or more isolation structures 112.

In some embodiments, the gate electrode 107 may comprise a conductive material, such as a metal (e.g., tungsten, aluminum, or the like), doped polysilicon, or the like. In some embodiments, the gate dielectric 105 and the one or more isolation structures 112 may comprise an oxide (e.g., silicon oxide), a nitride (e.g., silicon nitride), or the like.

In some embodiments, the base region 107b may have a first thickness 204 and the one or more gate extensions 107e may have a second thickness 206. In some embodiments, the second thickness 206 may less than to the first thickness 204. For example, in some embodiments, the second thickness 206 may be between 50% and approximately 90% of the first thickness 204. In some embodiments, the first thickness 204 may be in a range of between approximately 900 Angstroms (Å) and approximately 600 Å, between approximately 650 Å and approximately 750 Å, or other similar values. In other embodiments (not shown), the second thickness 206 may approximately equal to the first thickness 204.

A plurality of conductive interconnects 210-212 are disposed within an inter-level dielectric (ILD) structure 208 over the substrate 102. In some embodiments, the plurality of conductive interconnects 210-212 may comprise one or more conductive contacts 210 coupled to interconnect wires 212. In some embodiments, the one or more conductive contacts 210 are electrically coupled to the source region 104, the drain region 108, and the gate electrode 107. In some embodiments, the plurality of conductive interconnects 210-212 may comprise one or more of copper, tungsten, aluminum, or the like. In some embodiments, the ILD structure 208 may comprise one or more of silicon dioxide, doped silicon dioxide (e.g., carbon doped silicon dioxide), silicon oxynitride, borosilicate glass (BSG), phosphoric silicate glass (PSG), borophosphosilicate glass (BPSG), fluorinated silicate glass (FSG), or the like.

FIG. 2B illustrates a top-view 202 of the integrated chip of FIG. 2A. The cross-sectional view 200 of FIG. 2A is taken along cross-sectional line A-A' of FIG. 2B.

As shown in top-view 202 of FIG. 2B, the one or more gate extensions 107e protrude outward from a sidewall of the base region 107b along the first direction 114, while the base region 107b extends in a second direction 116 past the one or more gate extensions 107e. Adjacent ones of the one or more gate extensions 107e are separated along the second direction 116 by both the drift region 110 and parts of at least two of the one or more isolation structures 112.

In some embodiments, the one or more isolation structures 112 continuously extend along the first direction 114 from a first end contacting the gate dielectric 105 to a second end contacting the drain region 108. In some embodiments, the one or more gate extensions 107e are separated from the drain region 108 by the one or more isolation structures 112. In such embodiments, the one or more gate extensions 107e are separated from an end of the one or more isolation structures 112 by a non-zero distance d. In various embodiments, the non-zero distance d may be in a range of between approximately 400 µm and approximately 1,000 µm, between approximately 400 µm and approximately 750 µm, between approximately 250 µm and approximately 500 µm, or other suitable values.

FIG. 2C illustrates a cross-sectional view 216 of the integrated chip taken along cross-sectional line B-B' of FIG. 2B.

As shown in the cross-sectional view 216, the one or more isolation structures 112 are disposed within trenches 218 formed by interior surfaces 102i of the substrate 102. The gate extensions 107e are disposed within additional trenches 220 that are formed by interior surfaces 112i of the one or more isolation structures 112. This allows the one or more gate extensions 107e to be separated from one another by the drift region 110 and the one or more isolation structures 112 along the second direction 116.

As shown in cross-sectional view 200 of FIG. 2A and cross-sectional view 216 of FIG. 2C, a depletion region 214 is present along a p-n junction between the drift region 110 and the well region 109 and/or the substrate 102. The depletion region 214 causes an electric field to form along the p-n junction. The electric field increases during operation of the transistor device due to bias voltages applied to the source region 104, the drain region 108, and/or the gate electrode 107. However, the one or more gate extensions 107e are able to generate electric fields that spread out charges along the p-n junction.

Figure 2D:
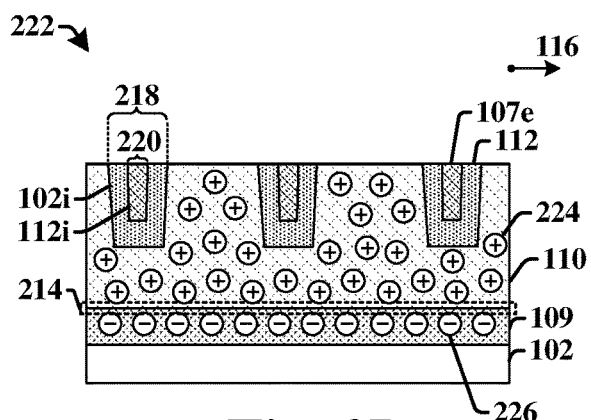

For example, FIG. 2D illustrates a cross-sectional view 222 of the integrated chip, taken along cross-sectional line B-B' of FIG. 2B, during operation of the high voltage transistor device.

As shown in cross-sectional view 222 of FIG. 2D, during operation a bias voltage may be applied to the one or more gate extensions 107e. The bias voltage causes the one or more gate extensions 107e to form an electric field that extends into the well region 109 and the drift region 110. The electric field causes charges, 224 and 226, having opposite polarities to accumulate within the well region 109 and within the drift region 110 due to the doping types of the well region 109 and the drift region 110. For example, in some embodiments, negative charges 224 may accumulate within the well region 109 and positive charges 226 may accumulate within the drift region 110. The one or more gate extensions 107e may spread out the charges, 224 and 226, along the second direction 116 and past outermost ones of the one or more gate extensions 107e. Spreading out the charges, 224 and 226, may increase a width of the depletion region 214 along the second direction 116 and mitigate spikes the electric field along a surface of the substrate 102 (e.g., so that a surface electric field above the p-n junction is less than a critical electric field corresponding to a breakdown voltage of the device). By decreasing spikes in the electric field along the surface of the substrate 102 a breakdown voltage of the high voltage transistor device is increased.

Figure 3:
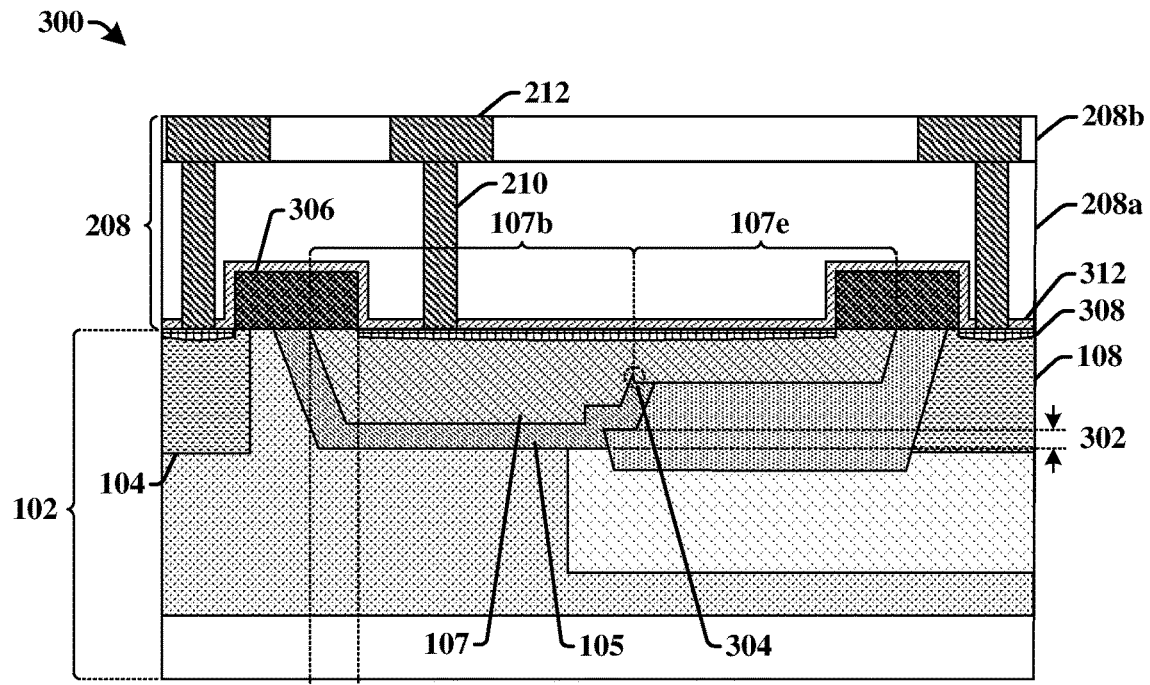
FIG. 3 illustrates a cross-sectional view of some additional embodiments of an integrated chip having a high voltage transistor device comprising a recessed gate electrode with gate extensions.

FIG. 3 illustrates a cross-sectional view of some additional embodiments of an integrated chip 300 having a high voltage transistor device comprising a recessed gate electrode with gate extensions.

The integrated chip 300 comprises a gate electrode 107 recessed below an upper surface of a substrate 102. The gate electrode 107 is separated from the substrate 102 by a gate dielectric 105 and by one or more isolation structures 112. The gate electrode 107 comprises a base region 107b disposed over the gate dielectric 105 and one or more gate extensions 107e protruding outward from the base region 107b to over the one or more isolation structures 112. The gate dielectric 105 extends along sidewalls and a lower surface of the base region 107b. The one or more isolation structures 112 extend along sidewalls and a lower surface of the one or more gate extensions 107e.

In some embodiments, the one or more isolation structures 112 may have a different thickness (e.g., a greater thickness) along bottoms of the one or more gate extensions 107e than along sidewalls of the one or more gate extensions 107e. In some embodiments, the one or more isolation structures 112 may vertically extend from bottoms of the one or more gate extensions 107e to below a bottommost surface of the gate dielectric 105. In some additional embodiments, the one or more isolation structures 112 may vertically extend from a horizontal plane extending along a top of the gate dielectric 105 to below the bottommost surface of the gate dielectric 105.

In some embodiments, the gate dielectric 105 may laterally extend directly over parts, but not all, of the one or more isolation structures 112. In some such embodiments, the gate dielectric 105 may line an upper surface and an interior sidewall of the one or more isolation structures 112. In some additional embodiments, the gate dielectric 105 may extend to a non-zero distance 302 below the upper surface of the one or more isolation structures 112. In such embodiments, the gate dielectric 105 may also line an outermost sidewall of the one or more isolation structures 112.

In some embodiments, the gate dielectric 105 may comprise a protrusion 304 that extends outward from an upper surface of the gate dielectric 105 between the base region 107b and the one or more gate extensions 107e. In some embodiments, the protrusion 304 extends to above a bottom surface of the one or more gate extensions 107e. In some embodiments, the protrusion 304 may have tapered sidewalls that cause a width of the protrusion 304 to decrease as a height over the upper surface increases. The protrusion 304 may be a result of an etching process used to form the one or more gate extensions 107e. For example, during fabrication the gate dielectric 105 may be formed along an angled sidewall of the one or more isolation structures 112. The one or more isolation structures 112 may be subsequently etched to form gate extension trenches extending from within the one or more isolation structures 112 to the angled sidewall. Over-etching of the gate dielectric 105 will cause the gate dielectric 105 to be recessed below a top of the angled sidewall, resulting in the protrusion 304. In other embodiments (not shown), the etching process may etch the gate dielectric 105 past the angled sidewall, so that the gate dielectric 105 the angled sidewall is completely removed and the resulting gate dielectric 105 has an outer sidewall that is separated from a sidewall of the isolation structures 112 by a non-zero distance that is over an upper surface of the one or more isolation structures 112.

In some embodiments, one or more dielectric structures 306 are disposed over opposing outer edges of the gate electrode 107. In some embodiments, the one or more dielectric structures 306 continuously extend from a first outer edge that is directly over the base region 107b to a second outer edge that is directly over a source region 104. In some embodiments, the one or more dielectric structures 306 continuously extend from a third outer edge that is directly over the one or more gate extensions 107e of the gate electrode 107 to a fourth outer edge that is directly over a drain region 108. In some embodiments, the one or more dielectric structures 306 may extend a non-zero distance 310 over opposing edges of the gate electrode 107. In some embodiments, the non-zero distance 310 may be in a range of between approximately 200 Å and approximately 600 Å, between approximately 350 Å and approximately 500 Å, or other suitable values. In some embodiments, the one or more dielectric structures 306 may comprise one or more dielectric materials, such as an oxide, a nitride, or the like.

A silicide 308 is arranged along upper surfaces of the source region 104, the drain region 108, and the gate electrode 107. The silicide 308 is configured to provide for a low resistance connection with conductive interconnects 210-212. In various embodiments, the silicide 308 may comprise a nickel silicide, a titanium silicide, or the like. In some embodiments, outer edges of the silicide 308 are laterally separated from outer edges of the source region 104, the drain region 108, and the gate electrode 107, so that parts of the source region 104, the drain region 108, and the gate electrode 107 that are directly below the one or more dielectric structures 306 may be free of the silicide 308.

A contact etch stop layer (CESL) 312 vertically separates the substrate 102 and the one or more dielectric structures 306 from a first inter-level dielectric (ILD) layer 208a. In some embodiments, the CESL 312 and/or the first ILD layer 208a extend from directly over the one or more dielectric structures 306 to along sidewalls of the one or more dielectric structures 306. A second ILD layer 208b is disposed on the first ILD layer 208a.

Figure 4:
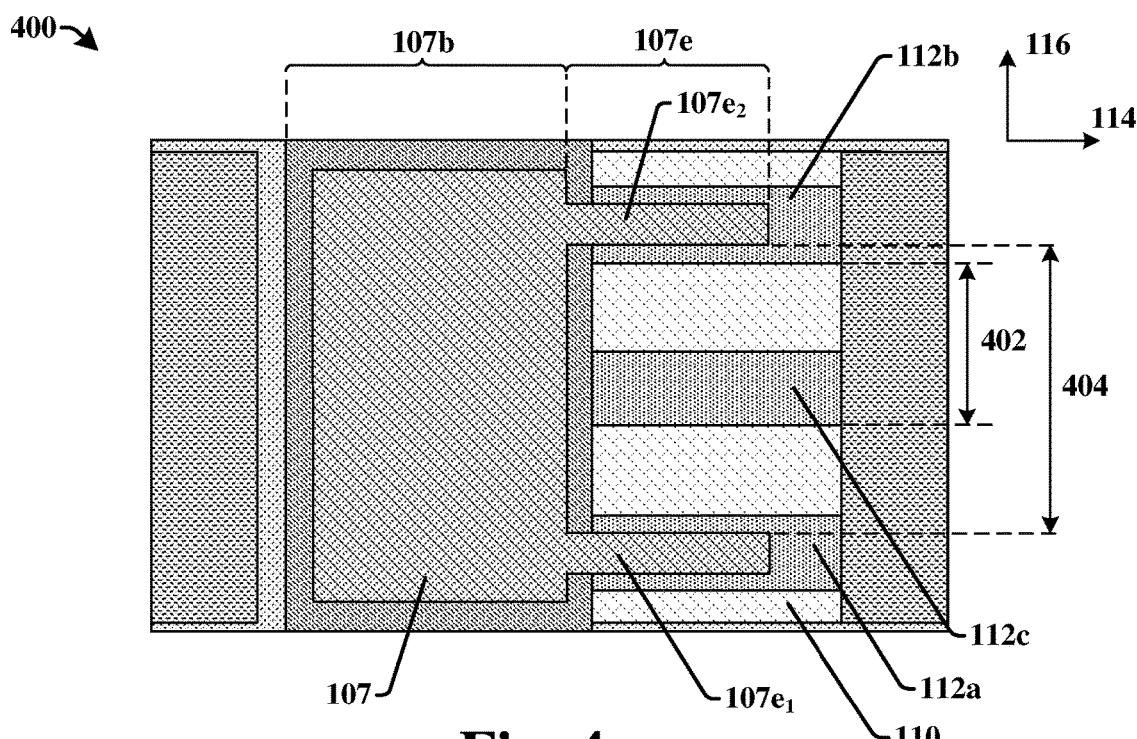
FIG. 4 illustrates a top-view of some additional embodiments of an integrated chip having a high voltage transistor device comprising a gate electrode with gate extensions.

FIG. 4 illustrates a top-view of some additional embodiments of an integrated chip 400 having a high voltage transistor device comprising a gate electrode with gate extensions.

The integrated chip 400 comprises a gate electrode 107 having a base region 107b and one or more gate extensions 107e. The one or more gate extensions 107e protrude outward from the base region 107b along a first direction 114 to within one or more isolation structures 112. The one or more gate extensions 107e are separated from one another along a second direction 116 that is perpendicular to the first direction 114.

In some embodiments, the one or more isolation structures 112 may be arranged along the second direction 116 at a pitch 402, while closest ones of the one or more gate extensions 107e are separated by a distance 404 that is larger than the pitch 402. In such embodiments, closest ones of the one or more gate extensions 107e are separated by an isolation structure that does not contain a gate extension. For example, in some embodiments, the one or more gate extensions 107e may comprise a first gate extension 107e$_1$ and a second gate extension 107e$_2$, which is a closest gate extension to the first gate extension 107e$_1$. The first gate extension 107e$_1$ is disposed within a first isolation structure 112a and the second gate extension 107e$_2$ is disposed within a second isolation structure 112b. A third isolation structure 112c, which does not surround a gate extension, separates the first gate extension 107e$_1$ from the second gate extension 107e$_2$.

Figure 5A:
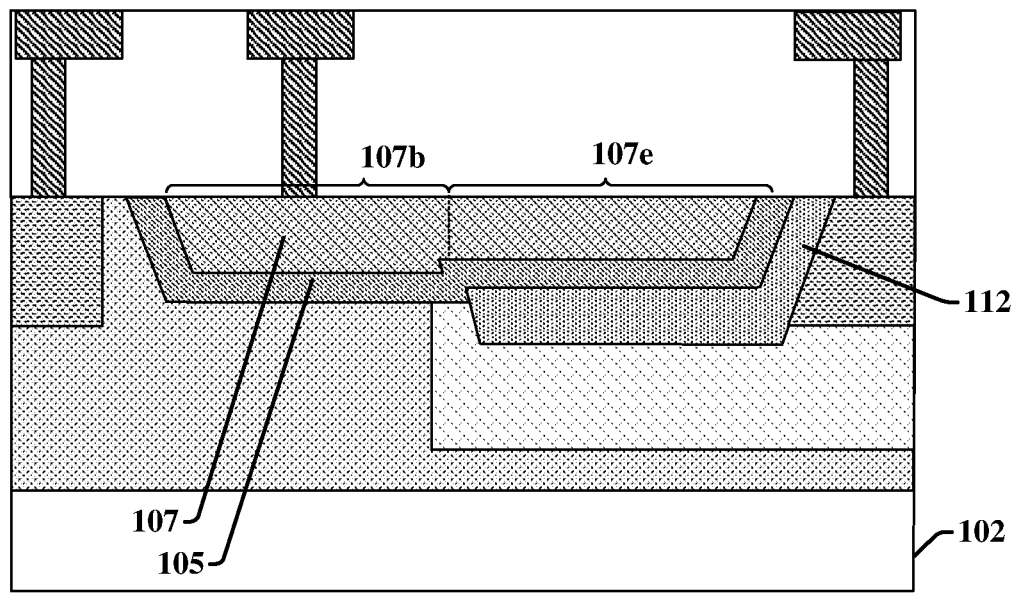
FIGS. 5A-5B illustrate some additional embodiments of an integrated chip having a high voltage transistor device comprising a recessed gate electrode with gate extensions.
Figure 5B:
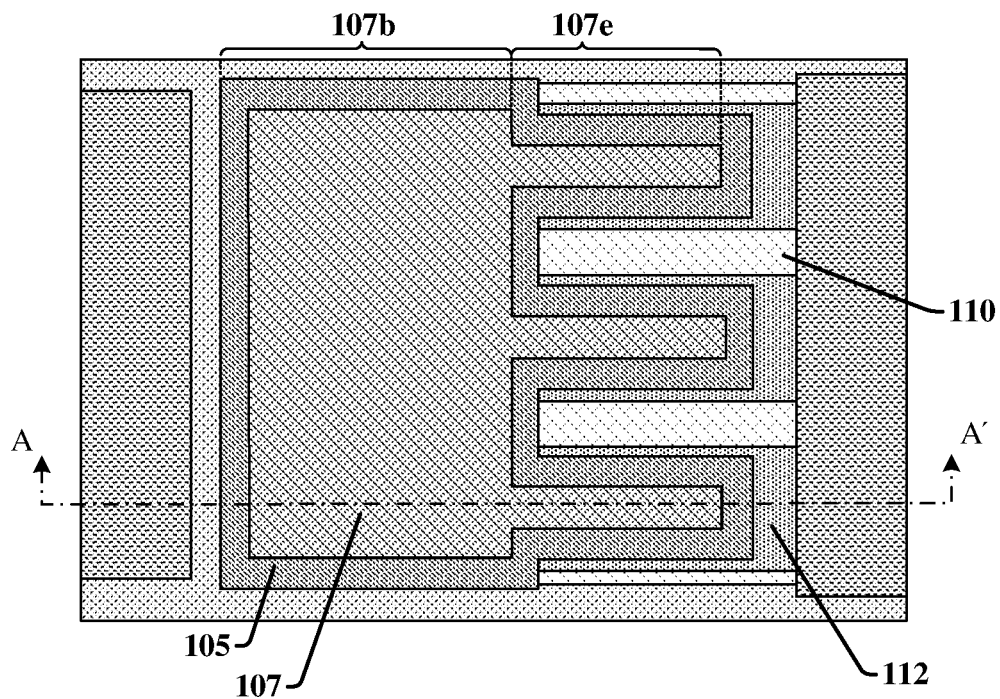

FIGS. 5A-5B illustrate some additional embodiments of an integrated chip having a high voltage transistor device comprising a recessed gate electrode with gate extensions.

As shown in cross-sectional view 500 of FIG. 5A (taken along cross-sectional line A-A' of FIG. 5B), the integrated chip comprises a gate electrode 107 disposed over a substrate 102. The gate electrode 107 comprises a base region 107b and one or more gate extensions 107e protruding outward from the base region 107b to over one or more isolation structures 112. A gate dielectric 105 continuously extends along sidewalls and a lower surface of the base region 107b and the one or more gate extensions 107e. The gate dielectric 105 vertically and laterally separates the one or more gate extensions 107e from the one or more isolation structures 112.

As shown in top-view 502 of FIG. 5B, the gate dielectric 105 extends around an outer perimeter of the gate electrode 107 in a closed and unbroken loop. By surrounding both the base region 107b and the one or more gate extensions 107e with the gate dielectric 105, one or more processing steps (e.g., one or more lithography and/or etch processes) can be eliminated from a fabrication process used to form the transistor device. By eliminating one or more processing steps from a fabrication process used to form the transistor device, a cost of forming the integrated chip can be reduced.

Figure 6A:
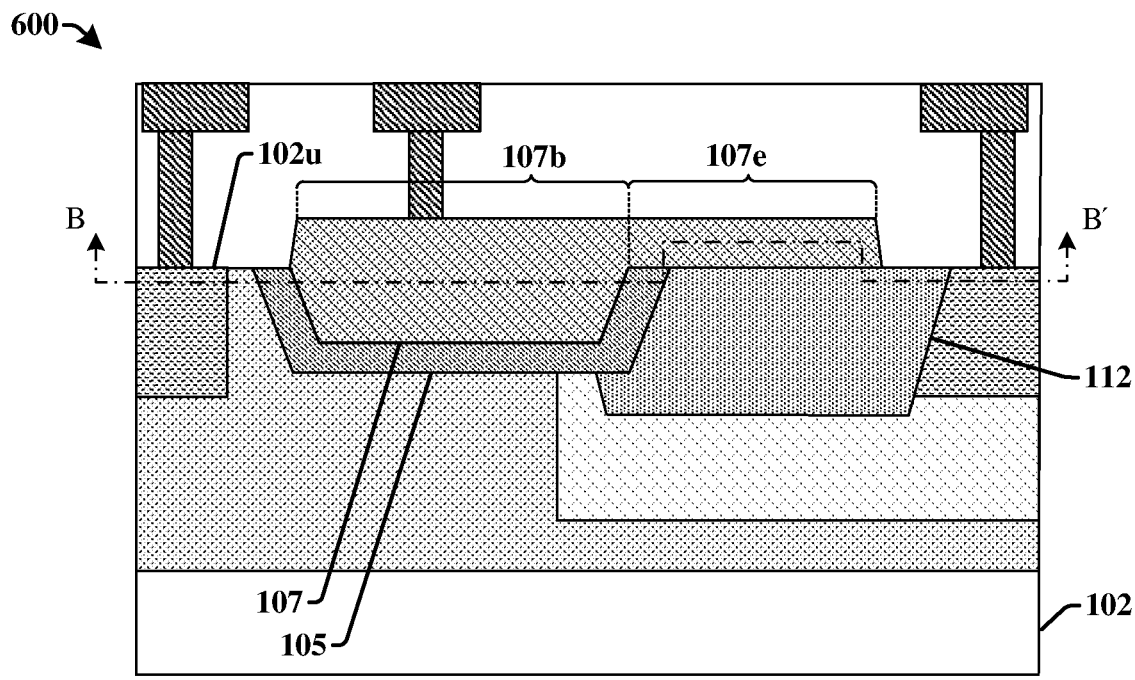
FIGS. 6A-6B illustrate some additional embodiments of an integrated chip having a high voltage transistor device comprising a partially recessed gate electrode with gate extensions.
Figure 6B:
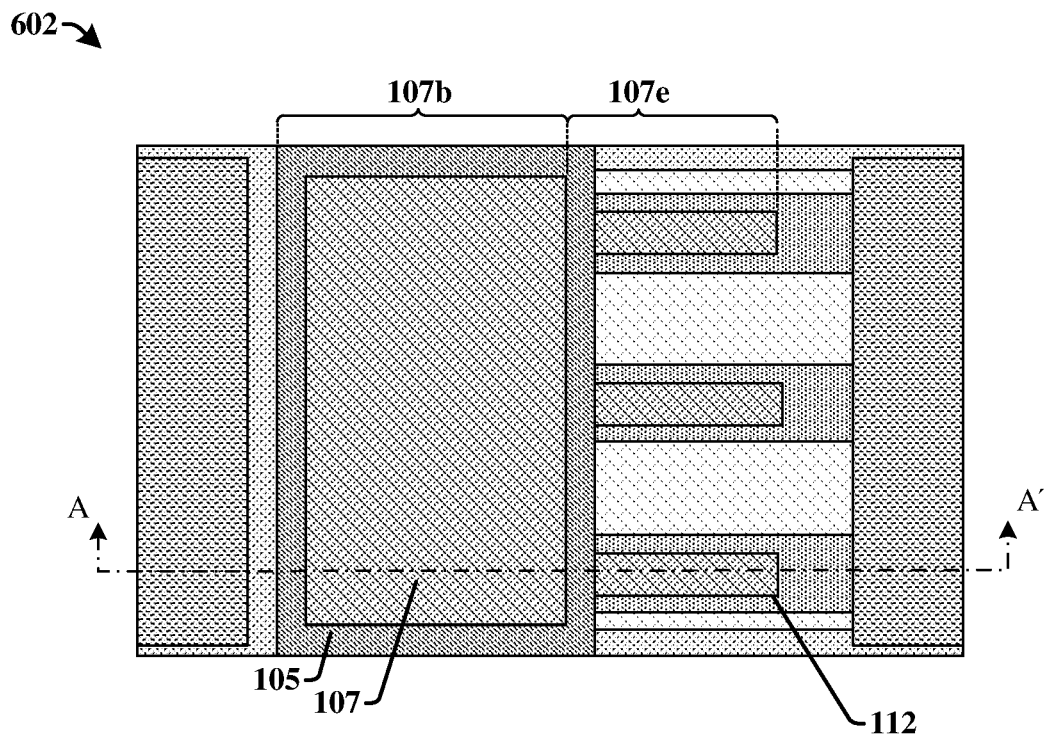

FIGS. 6A-6B illustrate some additional embodiments of an integrated chip having a high voltage transistor device comprising a gate electrode with gate extensions.

As shown in cross-sectional view 600 of FIG. 6A (taken along cross-sectional line A-A' of FIG. 6B), the integrated chip comprises a gate electrode 107 having a base region 107b and one or more gate extensions 107e. A gate dielectric 105 extends along sidewalls and a lower surface of the base region 107b. The base region 107b protrudes outward from an upper surface 102u of the substrate 102. The one or more gate extensions 107e protrude outward from a sidewall of the base region 107*b* that is over the upper surface 102*u* of the substrate 102 to directly over one or more isolation structures 112.

As shown in top-view 602 of FIG. 6B (taken along line B-B' of FIG. 6A), the gate dielectric 105 extends around an outer perimeter of the base region 107*b* in a closed and unbroken loop. By having the one or more gate extensions 107*e* protrude outward from a sidewall of the base region 107*b* that is over the upper surface 102*u* of the substrate 102, one or more processing steps (e.g., one or more lithography and/or etch processes) can be eliminated from a fabrication process used to form the transistor device. By eliminating one or more processing steps from a fabrication process used to form the transistor device, a cost of forming the integrated chip can be reduced.

Figure 7:
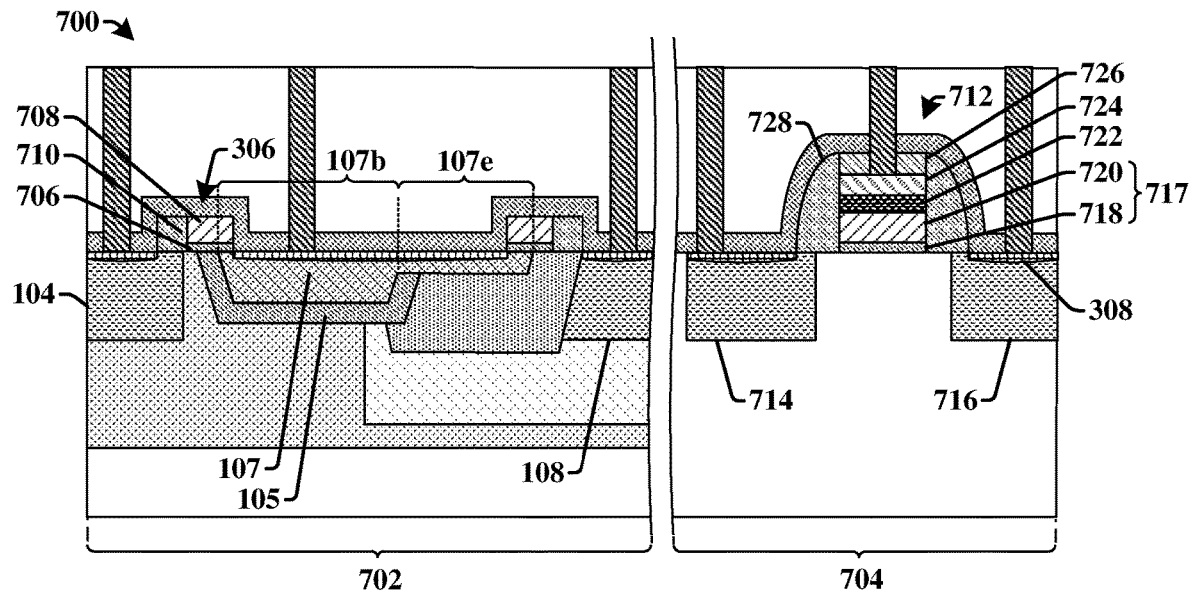
FIG. 7 illustrates a cross-sectional view of some embodiments of an integrated chip having a high voltage transistor device region and a peripheral logic region.

FIG. 7 illustrates a cross-sectional view of some embodiments of an integrated chip 700 having a high voltage transistor device region and a peripheral logic region.

The high voltage transistor device region 702 comprises a high-voltage transistor device that includes a gate electrode 107 disposed between a source region 104 and a drain region 108. The gate electrode 107 has a base region 107*b* and one or more gate extensions 107*e* extending outward from the base region 107*b*.

One or more dielectric structures 306 are disposed over opposing edges of the gate electrode 107. The one or more dielectric structures 306 respectively comprise a first dielectric material 706 and a second dielectric material 708 over the first dielectric material 706. In some embodiments, a third dielectric material 710 may extend along outermost sidewalls of the first dielectric material 706 and the second dielectric material 708. In some embodiments, the first dielectric material 706 and the second dielectric material 708 may comprise different dielectric materials, while the third dielectric material 710 may be a same dielectric material as the first dielectric material 706 or the second dielectric material 708. In various embodiments, the first dielectric material 706, the second dielectric material 708, and the third dielectric material 710 may comprise one or more of an oxide (e.g., silicon dioxide), a nitride (e.g., silicon nitride), a carbide (e.g., silicon carbide), or the like.

The peripheral logic region 704 comprises one or more additional transistor devices. The one or more additional transistor devices comprise a gate structure 712 that is arranged between a source region 714 and a drain region 716 and that is laterally surrounded by one or more sidewall spacers 728. The gate structure 712 comprises a gate dielectric structure 717 separating a gate electrode 722 from the substrate 102. One or more overlying dielectric layers 724-726 may be disposed over the gate electrode 722. In some embodiments, the gate dielectric structure 717 may comprise a first gate dielectric material 718 and a second gate dielectric material 720 over the first gate dielectric material 718. In some embodiments, the first gate dielectric material 718 may be a same material as first dielectric material 706, the second gate dielectric material 720 may be a same material as the second dielectric material 708, and the one or more sidewall spacers 728 may be a same material as the third dielectric material 710. In some embodiments, the first gate dielectric material 718 may have a substantially same thickness as the first dielectric material 706 and the second gate dielectric material 720 may have a substantially same thickness as the second dielectric material 708.

Figure 8:
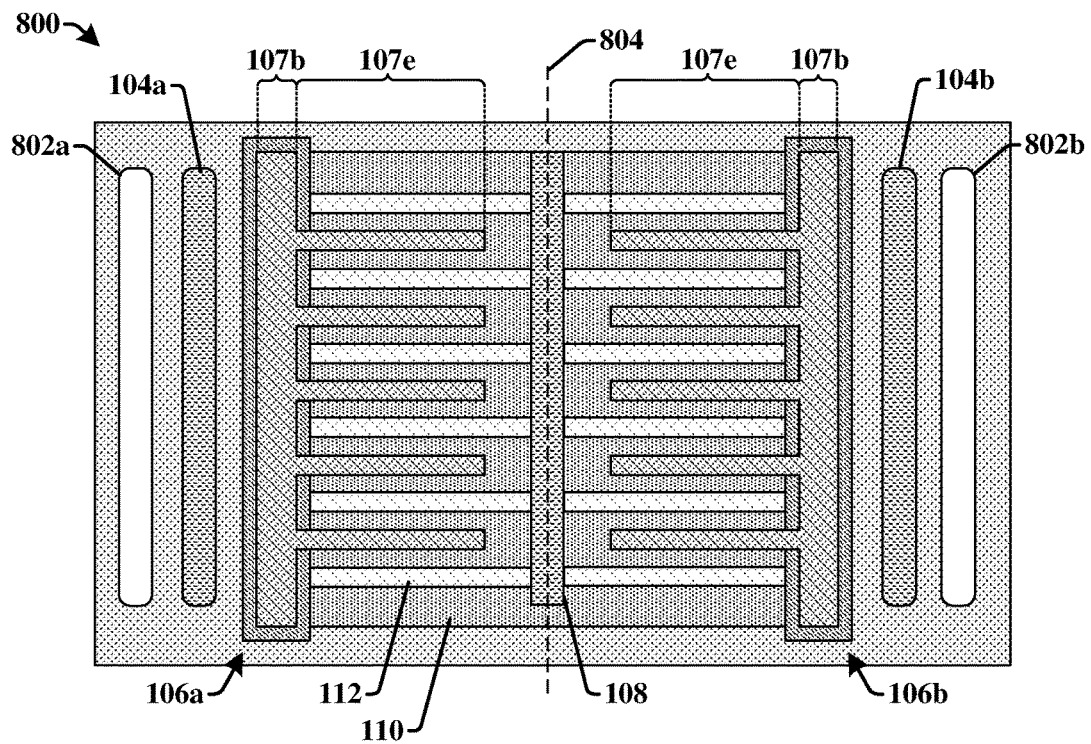
FIG. 8 illustrates a top-view of some additional embodiments of an integrated chip having a high voltage transistor device comprising a gate electrode with gate extensions.

FIG. 8 illustrates a top-view of some additional embodiments of an integrated chip 800 having a high voltage transistor device comprising a recessed gate electrode with gate extensions.

The integrated chip 800 comprises a drain region 108 that is surrounded on opposing sides by source regions 104*a*-104*b*. Gate structures 106*a*-106*b* are also disposed along opposing sides of the drain region 108 and separate the drain region 108 from the source regions 104*a*-104*b*, respectively. The gate structures 106*a*-106*b* respectively comprise a base region 107*b* and one or more gate extensions 107*e* that extend outward from the base region 107*b* towards the drain region 108. In some embodiments, body regions 802*a*-802*b* may be separated from the gate structures 106*a*-106*b* by the source regions 104*a*-104*b*.

In some embodiments, the source regions 104*a*-104*b* are electrically coupled together and the gate structures 106*a*-106*b* are electrically coupled together. In some additional embodiments, the gate structures 106*a*-106*b*, the source regions 104*a*-104*b*, and the body regions 802*a*-802*b* are substantially symmetric about a line 804 that bisects the drain region 108.

During operation, charges within the drift region 110 and charges within the gate extensions 107*e* are separated by both the gate dielectric 105 and the one or more STI regions 112. Because the gate extensions 107*e* laterally spread out the charges within the drift region 110, the gate extensions 107*e* increase a capacitance between the drift region 110 and the gate electrodes 107.

Figure 9A:
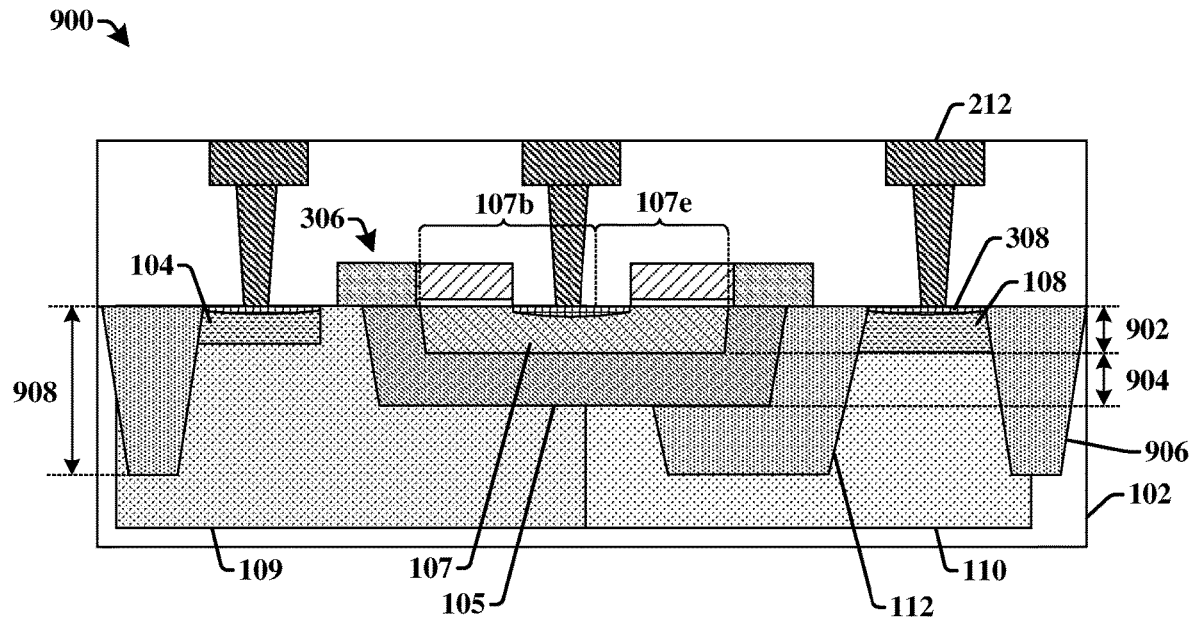
FIGS. 9A-9B illustrate some additional embodiments of an integrated chip having a high voltage transistor device comprising a recessed gate electrode with gate extensions.
Figure 9B:
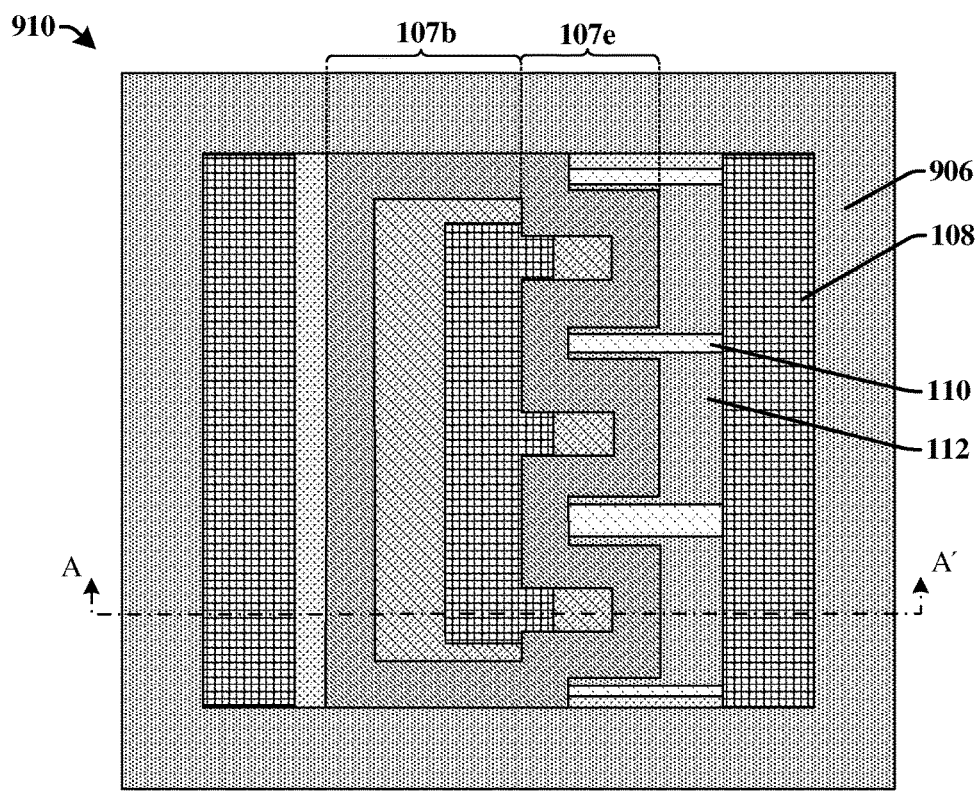

FIGS. 9A-9B illustrate some additional embodiments of an integrated chip having a high voltage transistor device comprising a recessed gate electrode with gate extensions.

As shown in cross-sectional view 900 of FIG. 9A, a gate electrode 107 is disposed within a substrate 102 between a source region 104 and a drain region 108. The gate electrode 107 comprises a base region 107*b* surrounded by a gate dielectric 105 and one or more gate extensions 107*e* that are surrounded by one or more isolation structures 112. In some embodiments, the gate electrode 107 extends into the substrate 102 to a first depth 902. In some embodiments, the first depth 902 may be in a range of between approximately 200 Å and approximately 800 Å, between approximately 500 Å and approximately 700 Å, or other suitable values. In some embodiments, the gate dielectric 105 may have a thickness 904 that is in a range of between approximately 700 Å and approximately 1,000 Å, between approximately 800 Å and approximately 900 Å, or other suitable values.

In some embodiments, the source region 104 and the drain region 108 are laterally surrounded by one or more additional isolation structures 906. The one or more additional isolation structures 906 are separated from the one or more isolation structures 112 by way of the source region 104 and the drain region 108. In some embodiments, the one or more isolation structures 112 extend into the substrate 102 to a second depth 908 that is substantially the same as the one or more additional isolation structures 906. In some embodiments, the second depth 908 may be in a range of between approximately 2,000 Å and approximately 3,000 Å, between approximately 2,000 Å and approximately 2,500 Å, or other suitable values. As shown in top-view 910 of FIG. 9B, in some embodiments, the one or more additional isolation structures 906 may wrap around the transistor device in a closed loop.

FIGS. 10A-24 illustrate some embodiments of method of forming an integrated chip having a high voltage transistor device comprising a recessed gate electrode with gate extensions. Although FIGS. 10A-24 are described in relation to a method, it will be appreciated that the structures disclosed in FIGS. 10A-24 are not limited to such a method, but instead may stand alone as structures independent of the method.

Figure 10A:
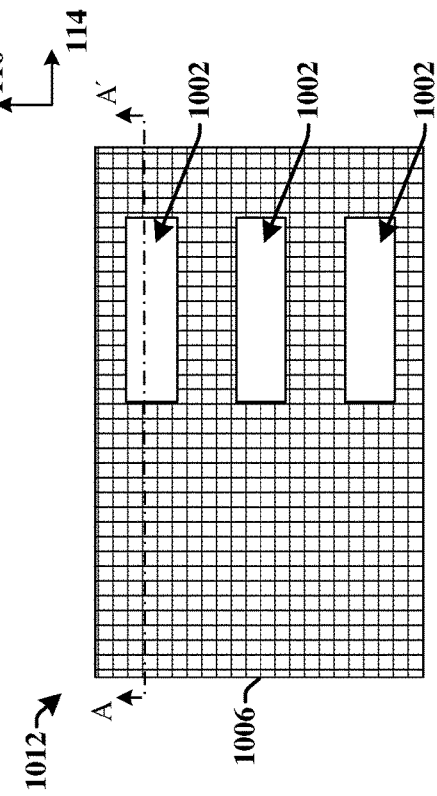
Figure 10B:
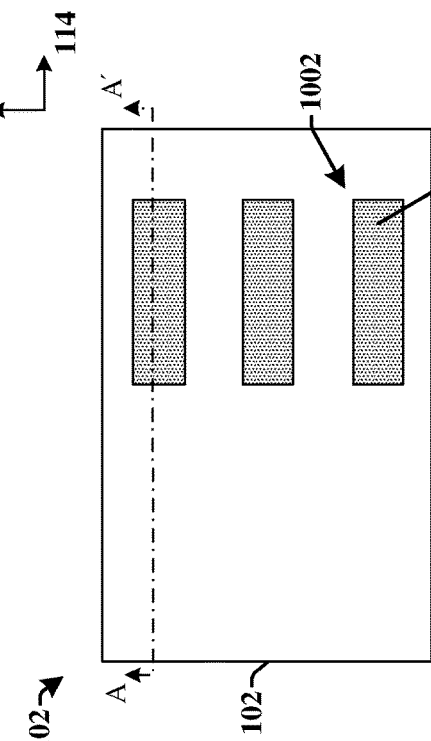

As shown in cross-sectional view 1000 of FIG. 10A, a substrate 102 is patterned to form one or more isolation trenches 1002. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. The one or more isolation trenches 1002 are formed by sidewalls and a horizontally extending surface of the substrate 102. As shown in top-view 1012 of FIG. 10B, in some embodiments the one or more isolation trenches 1002 comprise rectangular shaped trenches that extend in parallel to each other along a first direction 114 and that are separated from one another along a second direction 116 that is perpendicular to the first direction 114.

In some embodiments, the one or more isolation trenches 1002 may be formed by selectively exposing the substrate 102 to a first etchant 1004 according to a first masking layer 1006. In some embodiments, the first masking layer 1006 may comprise a hard mask comprising a first hard mask layer 1008 and a second hard mask layer 1010 over the first hard mask layer 1008. In some embodiments, the first hard mask layer 1008 comprises a first dielectric material (e.g., an oxide, a nitride, or the like) and the second hard mask layer 1010 comprises a second dielectric material (e.g., an oxide a nitride, or the like) that is different than the first dielectric material. In some embodiments, the first etchant 1004 may comprise a dry etchant. For example, in some embodiments, the first etchant 1004 may comprise an oxygen plasma etchant.

Figure 11A:
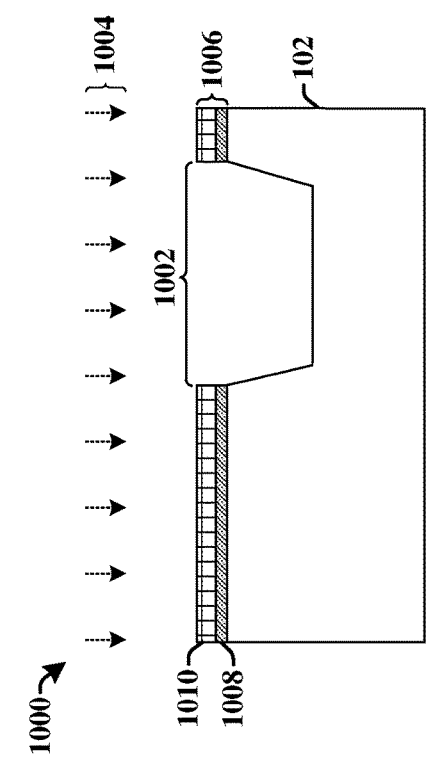
Figure 11B:
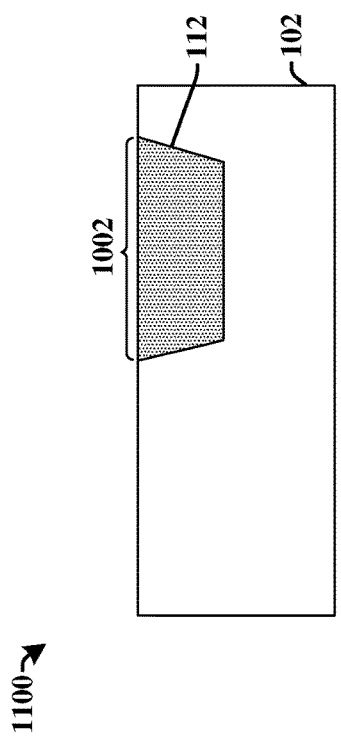

As shown in cross-sectional view 1100 of FIG. 11A, isolation structures 112 are formed within the one or more isolation trenches 1002. As shown in top view 1102 of FIG. 11B, the one or more isolation structures 112 are separated from one another along the second direction 116. In some embodiments, the one or more isolation structures 112 may be formed by forming one or more dielectric materials within the one or more isolation trenches 1002. In some embodiments, the one or more dielectric materials may comprise an oxide, a nitride, or the like. In some embodiments, the one or more dielectric materials may be formed by way of a deposition process (e.g., a chemical vapor deposition (CVD) process, a plasma enhanced CVD process, or the like). In some embodiments, the one or more dielectric materials may be formed within the one or more isolation trenches 1002 prior to removal of an entirety of the first masking layer (1006 of FIG. 10A). A planarization process (e.g., a chemical mechanical planarization process) may be subsequently performed to remove excess of the dielectric material from laterally outside of the one or more isolation trenches 1002. In some embodiments, the one or more isolation structures 112 may be formed concurrent with the formation of additional isolation structures (not shown) that provide isolation between adjacent transistor devices (e.g., as shown in FIGS. 9A-9B).

As shown in cross-sectional view 1200 of FIG. 12A, a gate base recess 1202 is formed within the substrate 102. In some embodiments, the gate base recess 1202 may also extend to within the one or more isolation structures 112. In some embodiments, the gate base recess 1202 extends into the substrate 102 to a first depth 1208 that is less than a second depth 1210 of the one or more isolation structures 112. The gate base recess 1202 is formed by one or more sidewalls 1202$s_1$ and a horizontally extending surface 1202$h_1$ of the substrate 102. In some embodiments, the gate base recess 1202 may be further formed by one or more sidewalls 1202$s_2$ and a horizontally extending surface 1202$h_2$ of the one or more isolation structures 112. As shown in top-view 1212 of FIG. 12B, the gate base recess 1202 continuously extends in the second direction 116 past opposing sidewalls of the one or more isolation structures 112.

In some embodiments, the gate base recess 1202 may be formed by selectively exposing the substrate 102 to a second etchant 1204 according to a second masking layer 1206. In various embodiments, the second masking layer 1206 may comprise a hard mask layer, a photosensitive material (e.g., photoresist), or the like. In some embodiments, the second etchant 1204 may comprise a dry etchant. For example, in some embodiments, the second etchant 1204 may comprise an oxygen plasma etchant.

As shown in cross-sectional view 1300 of FIG. 13A and top-view 1306 of FIG. 13B, a well region 109 and a drift region 110 are formed within the substrate 102. The drift region 110 laterally surrounds the one or more isolation structures 112 and vertically extends to below the one or more isolation structures 112. The well region 109 vertically and/or laterally abuts the drift region 110. In some embodiments, the well region 109 may be formed by implanting a first dopant species into the substrate 102 and the drift region 110 may be formed by subsequently implanting a second dopant species 1302 into the substrate 102 according to a third masking layer 1304. In various embodiments, the first dopant species may comprise a first doping type (e.g., formed by p-type dopants such as boron, aluminum, or the like) and the second dopant species 1302 may comprise a second doping type (e.g., formed by n-type dopants such as phosphorus, arsenic, or the like). In some embodiments, the third masking layer 1304 may comprise a photosensitive material (e.g., a photoresist). In some alternative embodiments, the well region 109 and/or the drift region 110 may be formed prior to forming the one or more isolation structures 112.

As shown in cross-sectional view 1400 of FIG. 14A and top-view 1402 of FIG. 14B, a gate dielectric 105 is formed over the substrate 102. In some embodiments, the gate dielectric 105 is formed within the gate base recess 1202, and over the substrate 102 and the one or more isolation structures 112. In some embodiments, the gate dielectric 105 may comprise an oxide, a nitride, or the like. In some embodiments, the gate dielectric 105 may be formed by way of a deposition process (e.g., a CVD process, a PE-CVD process, or the like).

As shown in cross-sectional view 1500 of FIG. 15A, one or more gate extension trenches 1502 are formed within the one or more isolation structures 112. The one or more gate extension trenches 1502 extend into the one or more isolation structures 112 to a third depth 1504 that is less than the second depth 1210. In some embodiments, the third depth 1504 may also be less than the first depth 1208 of the gate base recess 1202. In some embodiments, the one or more isolation structures 112 extend a distance d past the one or more gate extension trenches 1502, so that the one or more gate extension trenches 1502 are formed by sidewalls and horizontally extending surfaces of the one or more isolation structures 112. FIG. 15B illustrates a top-view 1510 of the cross-sectional view 1500 of FIG. 15A. As shown in top-view 1510, the one or more gate extension trenches 1502 extend outward from different positions of the gate base recess 1202.

In some embodiments, the one or more gate extension trenches 1502 may be formed by selectively exposing the gate dielectric 105 and the one or more isolation structures 112 to a third etchant 1506 according to a fourth masking layer 1508. In various embodiments, the fourth masking layer 1508 may comprise a hard mask layer, a photosensitive material (e.g., photoresist), or the like. In some embodiments, the third etchant 1506 may comprise a dry etchant. In some alternative embodiments (not shown), the gate extension trenches 1502 may be formed concurrent with the gate base recess 1202. In some such embodiments, an etchant (e.g., a dry etchant comprising CF 4) having a relatively low etching selectivity between silicon and silicon oxide may be used. FIG. 15C illustrates a three-dimensional view 1512 of the cross-sectional view of FIG. 15A and the top-view 1510 of FIG. 15B after removal of the fourth masking layer 1508.

As shown in cross-sectional view 1600 of FIG. 16A and top-view 1604 of FIG. 16B, a gate material 1602 is formed within the gate base recess 1202 and within the one or more gate extension trenches 1502. In some embodiments, the gate material 1602 may be formed to extend from within the gate base recess 1202 and the one or more gate extension trenches 1502 to directly over an upper surface of the substrate 102. In some embodiments, the gate material 1602 may comprise polysilicon, a metal, or the like. In some embodiments, the gate material 1602 may be formed by way of a deposition process (e.g., a CVD process, a PE-CVD process, or the like) and/or a plating process (e.g., an electroplating process, an electroless plating process, or the like).

As shown in cross-sectional view 1700 of FIG. 17A, a planarization process is performed along line 1702 to form a gate electrode 107 by removing an excess of the gate material (1602 of FIG. 16) and the gate dielectric 105 from over the substrate 102. As shown in top-view 1704 of FIG. 17B, the gate electrode 107 comprises a base region 107*b* and one or more gate extensions 107*e* protruding laterally outward from a sidewall of the gate electrode 107 forming the base region 107*b* to directly over the one or more isolation structures 112. In some embodiments, the planarization process may comprise a chemical mechanical planarization (CMP) process.

As shown in cross-sectional view 1800 of FIG. 18, a gate stack 1802 is formed over the substrate 102. The gate stack 1802 extends past opposing sides of the gate electrode 107. In some embodiments, the gate stack 1802 may comprise a first dielectric material 706, a second dielectric material 708 over the first dielectric material 706, a gate electrode material 1804 over the second dielectric material 708, a third dielectric material 1806 over the gate electrode material 1804, and a fourth dielectric material 1808 over the third dielectric material 1806.

As shown in cross-sectional view 1900 of FIG. 19, the gate stack (1802 of FIG. 18) is patterned to form a patterned gate stack 1902. In some embodiments, after patterning the gate stack (1802 of FIG. 18) one or more sidewall spacers 1904 are formed along opposing sides of the patterned gate stack 1902. The patterned gate stack 1902 exposes a source area 1906 and a drain area 1908 of the substrate 102 on opposing sides of the gate electrode 107. In some embodiments (not shown), the gate stack may be patterned to form an additional gate stack in a peripheral logic region on another part of the substrate (e.g., as shown in FIG. 7).

As shown in cross-sectional view 2000 of FIG. 20, one or more dopant species 2002 are implanted into the substrate 102 to form a source region 104 and a drain region 108 on opposing sides of the gate electrode 107. In some embodiments, the one or more dopant species 2002 may be selectively implanted into the substrate 102 according to the patterned gate stack 1902. In such embodiments, the source region 104 is formed within the source area 1906 and the drain region 108 is formed within the drain area 1908. In various embodiments, the one or more dopant species 2002 may comprise n-type dopants (e.g., phosphorus, arsenic, etc.) or p-type dopants (e.g., boron, aluminum, etc.). In some embodiments, an anneal may be performed after the one or more dopant species 2002 are implanted into the substrate 102 to drive the dopants further into the substrate 102.

Figure 21:
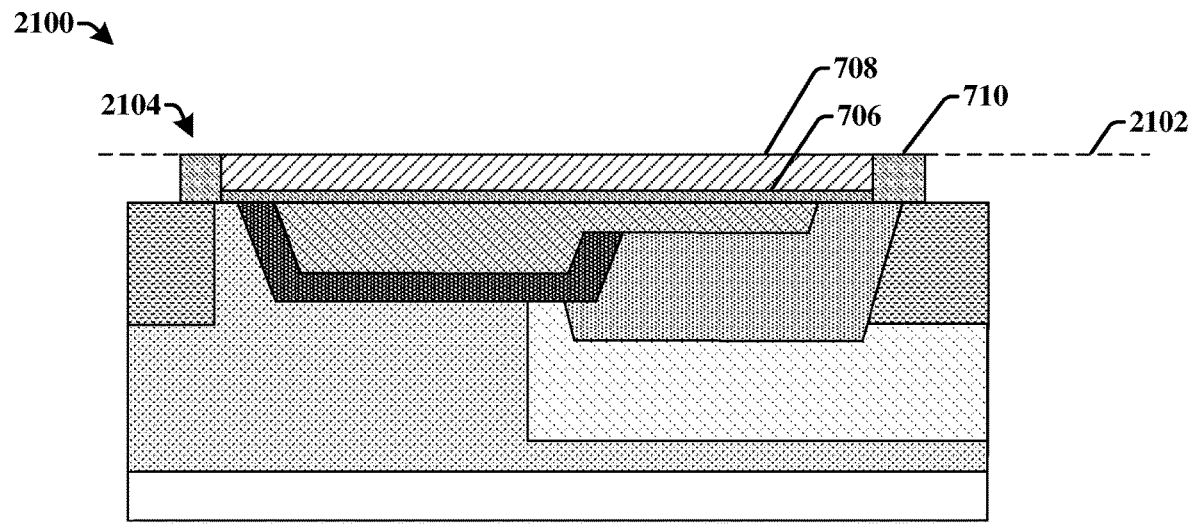

As shown in cross-sectional view 2100 of FIG. 21, a planarization process is performed (along line 2102) on the patterned gate stack (1902 of FIG. 20) to remove one or more layers of the patterned gate stack and to form a dielectric stack 2104. In some embodiments, the planarization process removes the gate electrode material (1804 of FIG. 18), the third dielectric material (1806 of FIG. 18), and the fourth dielectric material (1808 of FIG. 18). In some embodiments, the planarization process may comprise a chemical mechanical polishing (CMP) process.

Figure 22:
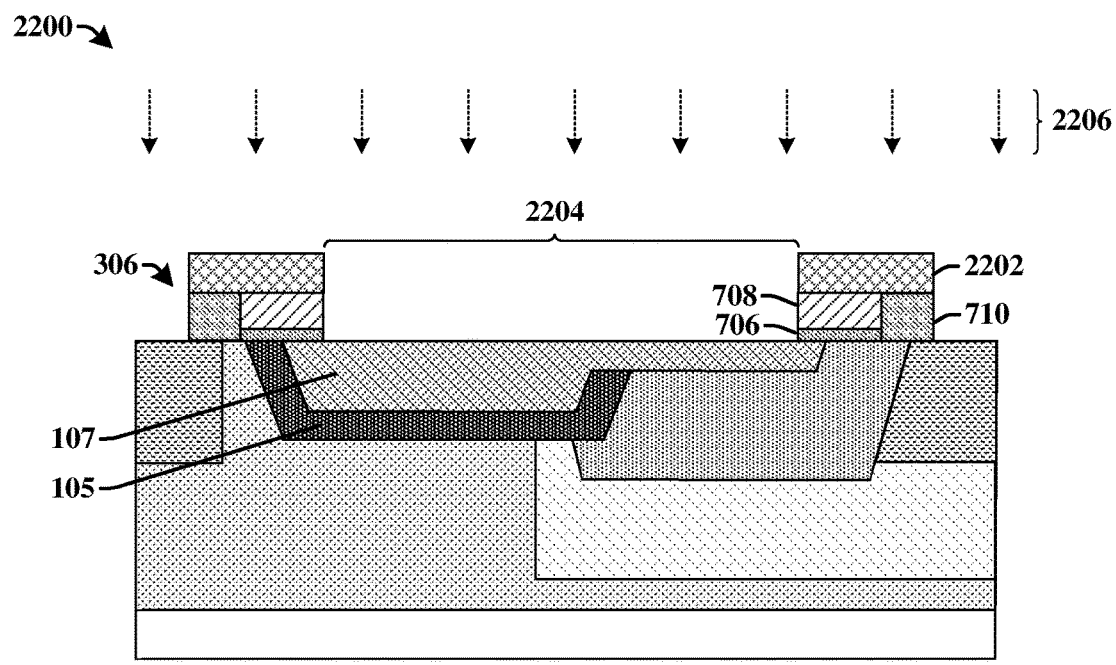

As shown in cross-sectional view 2200 of FIG. 22, the dielectric stack (2104 of FIG. 21) may be selectively etched to remove parts of the dielectric stack. In some embodiments, the dielectric stack is not removed from over the gate dielectric 105 so as to prevent damage to the gate dielectric 105. In such embodiments, etching the dielectric stack forms one or more dielectric structures 306 that cover at least one uppermost surface of the gate dielectric 105 and have sidewalls forming an opening 2204 that extends through the one or more dielectric structures 306 to expose an upper surface of the gate electrode 107. In some embodiments, the dielectric stack (2104 of FIG. 21) may be selectively etched by forming a fifth masking layer 2202 over the dielectric stack and subsequently exposing unmasked parts of the dielectric stack to an etchant 2206 that removes unmasked parts of the dielectric stack.

Figure 23:
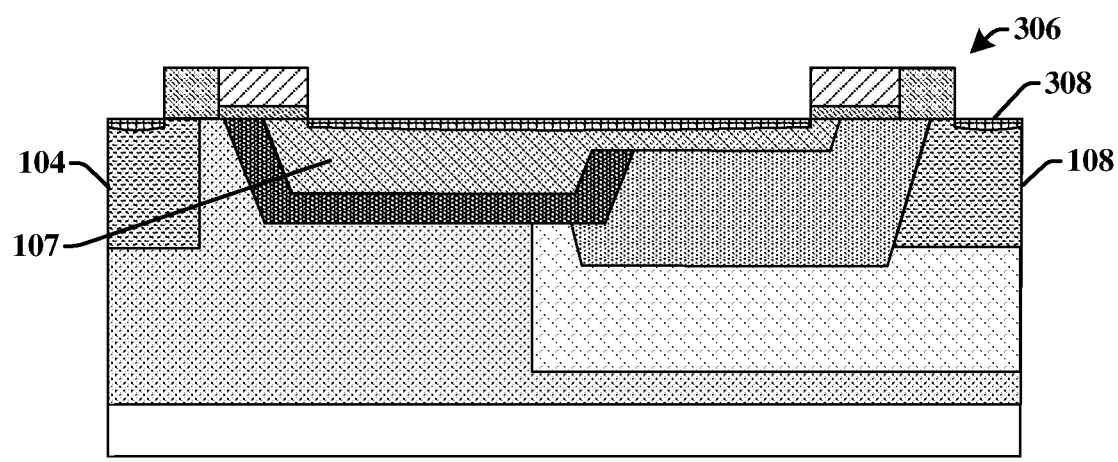

As shown in cross-sectional view 2300 of FIG. 23, a salicide process is performed. The salicide process forms a silicide 308 along upper surfaces of the source region 104, the drain region 108, and the gate electrode 107. In some embodiments, the silicide 308 is laterally set back from edges of the source region 104, the drain region 108, and the gate electrode 107 that are covered by the one or more dielectric structures 306. In some embodiments, the salicide process may be performed by depositing a metal (e.g., aluminum) onto the source region 104, the drain region 108, and the gate electrode 107, followed by a high temperature anneal.

Figure 24:
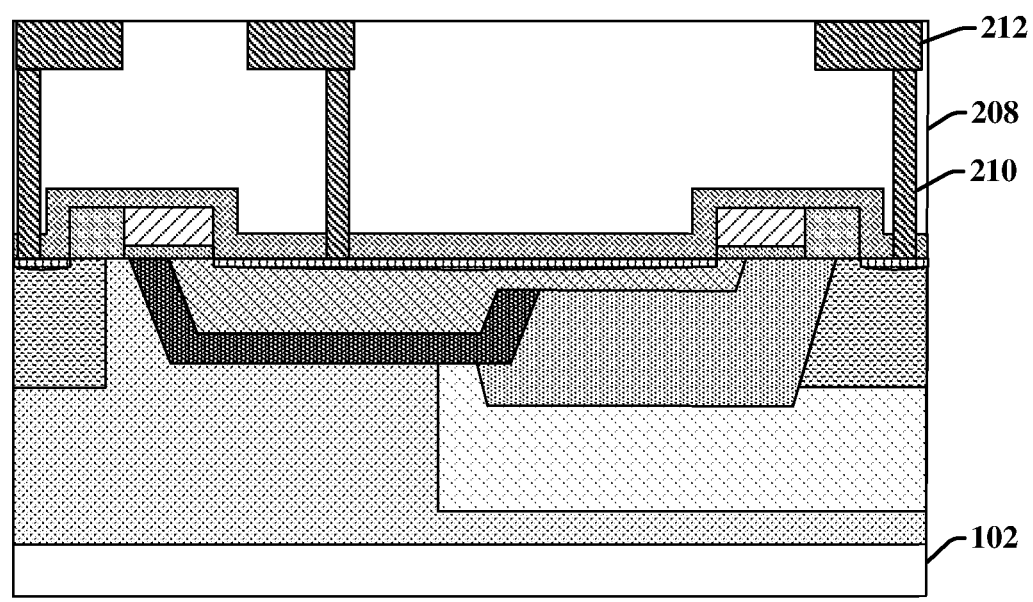

As shown in cross-sectional view 2400 of FIG. 24, an inter-level dielectric (ILD) structure 208 is formed over the substrate 102 and a plurality of conductive interconnects 210-212 are formed within the ILD structure 208. In some embodiments, the ILD structure 208 may comprise a plurality of stacked ILD layers formed over the substrate 102. In some embodiments (not shown), the plurality of stacked ILD layers are separated by etch stop layers (not shown). In some embodiments, the plurality of conductive interconnects 210-212 may comprise conductive contacts 210 and interconnect wires 212. In some embodiments, the plurality of conductive interconnects 210-212 may be formed by forming one of the one or more ILD layers (e.g., an oxide, a low-k dielectric, or an ultra low-k dielectric) over the substrate 102, selectively etching the ILD layer to form a via hole and/or a trench within the ILD layer, forming a conductive material (e.g., copper, aluminum, etc.) within the via hole and/or the trench, and performing a planarization process (e.g., a chemical mechanical planarization process).

Figure 25:
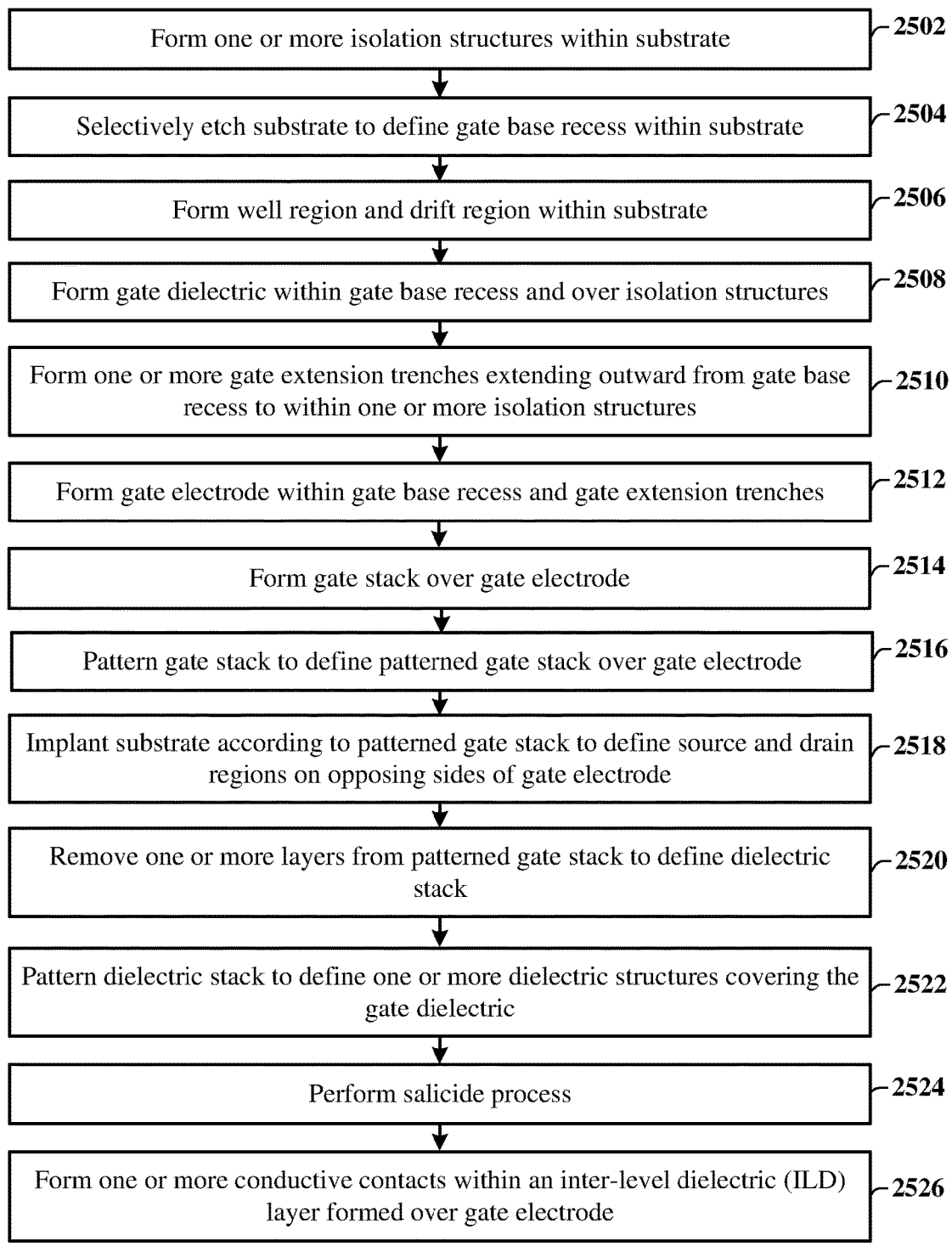
FIG. 25 illustrates a flow diagram of some embodiments of a method of forming an integrated chip having a high voltage transistor device comprising a recessed gate electrode with gate extensions.

FIG. 25 illustrates a flow diagram of some embodiments of a method 2500 of forming an integrated chip having a high voltage transistor device comprising a recessed gate electrode with gate extensions.

While the disclosed method 2500 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2502, one or more isolation structures are formed within a substrate. FIGS. 10A-11B illustrate cross-sectional views, 1000 and 1100, and top-views, 1012 and 1102, of some embodiments corresponding to act 2502.

At 2504, the substrate is selectively etched to form a gate base recess within the substrate. FIGS. 12A-12B illustrate a cross-sectional view 1200 and a top-view 1212 of some embodiments corresponding to act 2504.

At 2506, a well region and a drift region are formed within the substrate. FIGS. 13A-13B illustrate a cross-sectional view 1300 and a top-view 1306 of some embodiments corresponding to act 2506.

At 2508, a gate dielectric is formed within the gate base recess and over the one or more isolation structures. FIGS. 14A-14B illustrate a cross-sectional view 1400 and a top-view 1402 of some embodiments corresponding to act 2508.

At 2510, one or more gate extension trenches are formed to extend outward from the gate base recess to within the one or more isolation structures. FIGS. 15A-15C illustrate a cross-sectional view 1500, a top-view 1510, and a three-dimensional view 1512 of some embodiments corresponding to act 2510.

At 2512, a gate electrode is formed within the gate base recess and the one or more gate extension trenches. FIGS. 16A-17B illustrate cross-sectional views, 1600 and 1700, and top-views, 1604 and 1704, of some embodiments corresponding to act 2512.

At 2514, a gate stack is formed over the gate electrode. FIG. 18 illustrates a cross-sectional view 1800 of some embodiments corresponding to act 2514.

At 2516, the gate stack is patterned to form a patterned gate stack over the gate electrode. FIG. 19 illustrates a cross-sectional view 1900 of some embodiments corresponding to act 2516.

At 2518, the substrate is implanted according to the patterned gate stack to form source and drain regions on opposing sides of the gate electrode. FIG. 20 illustrates a cross-sectional view 2000 of some embodiments corresponding to act 2518.

At 2520, one or more layers are removed from the patterned gate stack to form a dielectric stack. FIG. 21 illustrates a cross-sectional view 2100 of some embodiments corresponding to act 2520.

At 2522, the dielectric stack is patterned to form one or more dielectric structures covering the gate dielectric. FIG. 22 illustrates a cross-sectional view 2200 of some embodiments corresponding to act 2522.

At 2524, a salicide process is performed. FIG. 23 illustrates a cross-sectional view 2300 of some embodiments corresponding to act 2524.

At 2526, one or more conductive contacts are formed within an inter-level dielectric (ILD) layer formed over the gate electrode. FIG. 24 illustrates a cross-sectional view 2400 of some embodiments corresponding to act 2526.

Accordingly, in some embodiments, the present disclosure relates to an integrated chip comprising a transistor device having a gate structure with gate extensions that are configured to provide the transistor device with a high breakdown voltage.

In some embodiments, the present disclosure relates to an integrated chip. The integrated chip includes a source region disposed within a substrate; a drain region disposed within the substrate and separated from the source region along a first direction; a drift region disposed within the substrate between the source region and the drain region; a plurality of isolation structures disposed within the drift region; and a gate electrode disposed within the substrate, the gate electrode having a base region disposed between the source region and the drift region and a plurality of gate extensions extending outward from a sidewall of the base region to over the plurality of isolation structures. In some embodiments, the plurality of isolation structures have outer sidewalls that are separated by the drift region along a second direction that is perpendicular to the first direction. In some embodiments, the plurality of isolation structures respectively extend past opposing sides of respective ones of the plurality of gate extensions along a second direction that is perpendicular to the first direction. In some embodiments, the plurality of gate extensions are separated from one another by the plurality of isolation structures and by the drift region along a second direction that is perpendicular to the first direction. In some embodiments, the plurality of isolation structures are between the plurality of gate extensions and the drain region. In some embodiments, the integrated chip further includes a gate dielectric disposed along sidewalls and a lower surface of the base region of the gate electrode, the plurality of isolation structures having sidewalls that directly contact a sidewall of the gate dielectric. In some embodiments, the integrated chip further includes a gate dielectric disposed along sidewalls and a lower surface of the base region of the gate electrode, the plurality of isolation structures continuously extending along an upper surface of the substrate from the gate dielectric to the drain region. In some embodiments, the plurality of isolation structures include one or more dielectric material disposed within trenches in the substrate; and the plurality of gate extensions are disposed within additional trenches formed by interior surfaces of the plurality of isolation structures. In some embodiments, the integrated chip further includes a gate dielectric disposed along sidewalls and a lower surface of the base region of the gate electrode; one or more dielectric structures disposed over opposing outer edges of the gate electrode and over the gate dielectric; and an inter-level dielectric (ILD) disposed over and along sidewalls of the one or more dielectric structures.

In other embodiments, the present disclosure relates to an integrated chip. The integrated chip includes a source region disposed within a substrate; a drain region disposed within the substrate; a gate dielectric lining interior surfaces of the substrate; a gate electrode disposed between the source region and the drain region and having a base region over the gate dielectric and a plurality of gate extensions, the plurality of gate extensions protruding outward from a sidewall of the base region of the gate electrode forming the drain region; and a plurality of isolation structures continuously extending between the gate dielectric and the drain region, the plurality of isolation structures respectively surrounding one of the plurality of gate extensions. In some embodiments, the integrated chip further includes a drift region disposed within the substrate between the base region and the drain region, the plurality of isolation structures are separated from one another by the drift region. In some embodiments, the drift region extends past opposing sides of the plurality of isolation structures along a first direction and along a second direction that is perpendicular to the first direction. In some embodiments, the integrated chip further includes one or more dielectric structures disposed over opposing outer edges of the gate electrode; an inter-level dielectric (ILD) disposed over and along sidewalls of the one or more dielectric structures; and a silicide arranged along an upper surface of the gate electrode, the one or more dielectric structures covering one or more parts of the gate electrode that are outside of the silicide. In some embodiments, the one or more dielectric structures respectively include a first dielectric material, a second dielectric material over the first dielectric material, and a third dielectric material along sidewalls of the first dielectric material and the second dielectric material. In some embodiments, the base region extends to a first depth below an upper surface of the substrate and the plurality of gate extensions extend to a second depth below the upper surface of the substrate, the second depth being less than the first depth. In some embodiments, the plurality of isolation structures extend to a greater depth within the substrate than the gate dielectric. In some embodiments, the gate dielectric includes a protrusion arranged between the base region and a gate extension of the plurality of gate extensions, the protrusion extending outward from an upper surface of the base region to above a bottom of the gate extension. In some embodiments, a bottom surface of a gate extension of the plurality of gate extensions is in contact with both an upper surface of the gate dielectric and an upper surface of an isolation structure of the plurality of isolation structures.

In yet other embodiments, the present disclosure relates to a method of forming an integrated chip. The method includes forming a plurality of isolation structures within a substrate; selectively etching the substrate to form a gate base recess within the substrate; selectively etching the plurality of isolation structures to form a plurality of gate extension trenches extending outward from the gate base recess; forming a conductive material within the gate base recess and the plurality of gate extension trenches to form a gate electrode; and forming a source region and a drain region on opposing sides of the gate electrode. In some embodiments, the method further includes forming a gate dielectric within the gate base recess prior to selectively etching the plurality of isolation structures to form the plurality of gate extension trenches.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
  a source region disposed within a substrate;
  a drain region disposed within the substrate and separated from the source region;
  a plurality of separate isolation structures disposed within the substrate, wherein the plurality of separate isolation structures have outermost sidewalls that face one another and that are separated from one another; and
  a gate electrode disposed within the substrate, wherein the gate electrode comprises a base region disposed between the source region and the plurality of separate isolation structures and a plurality of gate extensions extending outward from a side of the base region to directly over the plurality of separate isolation structures.

2. The integrated chip of claim 1, wherein the base region vertically extends from adjacent to respective ones of the plurality of gate extensions to below respective ones of the plurality of gate extensions.

3. The integrated chip of claim 1, wherein a sidewall of the base region extends between two neighboring ones of the plurality of gate extensions as viewed in a plan-view.

4. The integrated chip of claim 1, wherein the base region is arranged along a first end of the gate electrode and the plurality of gate extensions are arranged along an opposing second end of the gate electrode.

5. The integrated chip of claim 1,
  wherein the source region is separated from the drain region along a first direction; and
  wherein the base region has a width that is larger than widths of the plurality of gate extensions measured in a second direction that is perpendicular to the first direction.

6. The integrated chip of claim 1, wherein the plurality of gate extensions are directly between sidewalls of the plurality of separate isolation structures.

7. The integrated chip of claim 1, further comprising:
  a gate dielectric laterally and vertically separating the gate electrode from the substrate, wherein the gate electrode laterally and vertically contacts the plurality of separate isolation structures.

8. The integrated chip of claim 1, wherein the plurality of separate isolation structures cover a lower surface and an outermost sidewall of the plurality of gate extensions as viewed in a cross-sectional view.

9. The integrated chip of claim 1, wherein the substrate has a plurality of substrate fingers formed by sidewalls of the substrate that contact the plurality of separate isolation structures, the substrate fingers being interleaved with the plurality of gate extensions as viewed in a top-view.

10. An integrated chip, comprising:
  a source region disposed within a substrate;
  a drain region disposed within the substrate and separated from the source region along a first direction;
  one or more dielectric structures disposed within the substrate;
  a gate electrode disposed within the substrate, wherein the gate electrode comprises a base region and one or more gate extensions extending outward from the base region in the first direction to over the one or more dielectric structures; and
  a gate dielectric arranged along a sidewall and a lower surface of the gate electrode, wherein the gate electrode extends in the first direction past an outermost edge of the gate dielectric as viewed in a cross-sectional view.

11. The integrated chip of claim 10, wherein the gate dielectric has a first outermost sidewall that has a first length and an opposing second outermost sidewall that has a second length as viewed in the cross-sectional view, the second length being different than the first length.

12. The integrated chip of claim 11, wherein the second outermost sidewall is directly below the one or more gate extensions.

13. The integrated chip of claim 10, wherein the gate dielectric laterally straddles an interface between the one or more dielectric structures and the substrate.

14. The integrated chip of claim 10, wherein the base region, the one or more gate extensions, the gate dielectric, and the one or more dielectric structures have topmost surfaces that have been planarized to be substantially co-planar.

15. The integrated chip of claim 10, wherein the one or more gate extensions contact upper surfaces of the gate dielectric and the one or more dielectric structures.

16. An integrated chip, comprising:
a source disposed within a substrate;
a drain disposed within the substrate and separated from the source;
one or more isolation structures disposed within the substrate; and
a gate disposed within the substrate between the source and the drain, wherein the gate comprises a base and one or more extensions extending outward from a sidewall of the base, the one or more extensions being embedded within the one or more isolation structures.

17. The integrated chip of claim 16, wherein the gate laterally extends from over the one or more isolation structures to past an outermost sidewall of the one or more isolation structures.

18. The integrated chip of claim 16, wherein the substrate has one or more substrate fingers that are interleaved with the one or more extensions as viewed in a top-view.

19. The integrated chip of claim 16,
wherein the one or more isolation structures separate the one or more extensions from the substrate along a first direction and along a second direction in a top-view, the first direction being perpendicular to the second direction; and
wherein the one or more isolation structures separate the one or more extensions from the substrate along a third direction in a cross-sectional view, the third direction being perpendicular to both the first direction and the second direction.

20. The integrated chip of claim 16, wherein both the base and the one or more extensions are arranged along a topmost surface of the gate.

* * * * *